United States Patent
Cheng et al.

(10) Patent No.: US 9,290,376 B1
(45) Date of Patent: Mar. 22, 2016

(54) MEMS PACKAGING TECHNIQUES

(71) Applicant: Taiwan Semiconductor Manufacturing Co., Ltd., Hsin-Chu (TW)

(72) Inventors: Chun-Wen Cheng, Hsin-Chu (TW); Chien-Hsuan Tai, Tainan (TW); Chia-Hua Chu, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/737,896

(22) Filed: Jun. 12, 2015

(51) Int. Cl.
| | |
|---|---|
| *H01L 27/00* | (2006.01) |
| *B81B 7/00* | (2006.01) |
| *B81C 1/00* | (2006.01) |
| *H01L 27/12* | (2006.01) |
| *H01L 27/20* | (2006.01) |
| *H01L 27/146* | (2006.01) |

(52) U.S. Cl.
CPC ............ *B81B 7/007* (2013.01); *B81C 1/00301* (2013.01); *H01L 27/12* (2013.01); *B81B 2203/0127* (2013.01); *B81B 2203/0315* (2013.01); *B81B 2203/0361* (2013.01); *B81B 2203/04* (2013.01); *B81B 2207/012* (2013.01); *B81B 2207/096* (2013.01); *B81B 2207/115* (2013.01); *B81C 2203/036* (2013.01); *H01L 27/14692* (2013.01); *H01L 27/20* (2013.01)

(58) Field of Classification Search
CPC ................ B81B 7/007; B81B 2203/04; B81B 2203/0315; B81B 2203/0361; B81B 2203/0127; B81C 1/00301; B81C 2203/036; H01L 27/12; H01L 27/20; H01L 27/14692
See application file for complete search history.

(56) References Cited

U.S. PATENT DOCUMENTS

| | | | | |
|---|---|---|---|---|
| 8,330,559 | B2* | 12/2012 | Cheng ................. | B81C 1/00333 333/197 |
| 8,410,665 | B2* | 4/2013 | Chung ...................... | B81C 1/00 310/334 |
| 9,123,547 | B2* | 9/2015 | Chu .................... | H01L 27/0629 |
| 2012/0161582 | A1* | 6/2012 | Chung ...................... | B81C 1/00 310/339 |

(Continued)

OTHER PUBLICATIONS

"Pulse-Echo Ultrasonic Fingerprint Sensor on a Chip", Mechanical/Physical Sensors and Microsystems, 2 pages, Published on Jun. 21, 2015.

(Continued)

*Primary Examiner* — Nikolay Yushin
(74) *Attorney, Agent, or Firm* — Eschweiler & Associates, LLC

(57) ABSTRACT

In some embodiments, the present disclosure provides a MEMS package. The MEMS package includes a MEMS IC comprising a MEMS substrate, a dielectric layer disposed over the MEMS substrate, and a piezoelectric layer disposed over the dielectric layer. The dielectric layer includes a flexible diaphragm made of dielectric material, and the piezoelectric layer includes a piezoelectric opening over the flexible diaphragm. A CMOS IC includes a CMOS substrate and an electrical interconnect structure. The CMOS IC is bonded to the MEMS IC so the electrical interconnect structure is proximate to the piezoelectric layer and so the CMOS IC encloses a back cavity over the flexible diaphragm. A support layer is disposed between the electrical interconnect structure and the piezoelectric layer. The support layer has a support layer opening which is disposed at a position vertically aligned with the flexible diaphragm and which is a part of the back cavity.

20 Claims, 28 Drawing Sheets

(56) References Cited

U.S. PATENT DOCUMENTS

2013/0001710 A1* 1/2013 Daneman ............... H01L 23/10
 257/415
2014/0264744 A1* 9/2014 Chu ................... H01L 27/0629
 257/532

OTHER PUBLICATIONS

Rufer, et al., "Behavioural modelling and simulation of a MEMS-based ultrasonic pulse-echo system", TIMA Laboratory, pp. 1-10, Prof. SPIE. 4755, Apr. 19, 2002.

* cited by examiner

US 9,290,376 B1

MEMS PACKAGING TECHNIQUES

BACKGROUND

Microelectromechanical systems (MEMS) devices, such as accelerometers, pressure sensors, and microphones, have found widespread use in many modern day electronic devices. For example, MEMS pressure sensors are commonly found in automobiles (e.g., in airbag deployment systems), tablet computers, or in smart phones.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
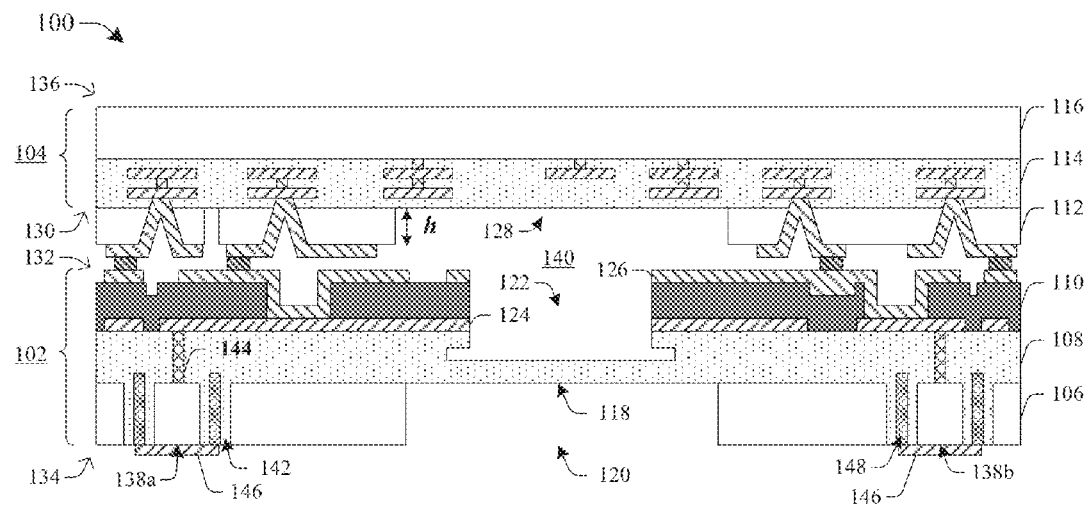
FIG. 1 illustrates a cross-sectional view of some embodiments of a microelectromechanical systems (MEMS) package.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "First", "second", "third", etc. are not intended to be descriptive of the corresponding element. Therefore, "a first element", such as a first dielectric layer for example, described in connection with a first figure may not necessarily corresponding to a "first element", such as a first dielectric layer for example, described in connection with another figure.

MEMS packages often comprise a MEMS die and an application specific integrated circuit (ASIC) die located on a shared package assembly, such as a leadframe. The ASIC die comprises an ASIC to receive and process electrical signal converted and transmitted from or to a MEMS device of the MEMS die. Conventionally, the ASIC die and MEMS die are set separately on the package assembly and connected together by way of one or more bonding wires and then packaged at a chip level (chip by chip). Some MEMS devices (e.g., motion sensors, pressure sensors, microphones, etc.) have a movable or flexible diaphragm disposed therein. The diaphragm can be located over an opening in the package assembly that allows the diaphragm to interact with an ambient environment where a stimuli comes through. In order to eliminate performance degradation, a plastic cap covers the back side of the MEMS device, forming a cavity with an applicable height as a step of the chip level packaging. This plastic cap can also stand over the ASIC die in some designs. The foregoing methods of packaging such MEMS devices introduce parasitic capacitance generated by the bonding wires between the ASIC and MEMS dies. Also, the chip level packaging, which forms separate individual packages for a number of MEMS devices singulated from one wafer, introduces a high cost and long process time.

Therefore, the present application is directed to MEMS packaging techniques including improved manufacturing methods and MEMS packages formed therefrom. The improved method uses a wafer level process to form a MEMS package. The wafer level process uses stack bonding of a CMOS wafer to a MEMS wafer to connect CMOS devices and MEMS devices. Further, in some embodiments, the improved method attaches a support layer to the CMOS wafer, wherein the support layer has an opening aligned with the MEMS device to increase a height of the back cavity at the wafer level. In some additional embodiments, the methods also include a VHF protective layer to prevent damage from vapor hydrofluoric acid employed during the process. The present application also discloses some embodiments of semiconductor structures of the MEMS packages resulting from the improved methods.

FIG. 1 shows a cross-sectional view of a MEMS package 100 according to some embodiments. As shown in FIG. 1, the MEMS package 100 comprises a MEMS IC 102 and a CMOS IC 104 that are bonded together. The MEMS IC 102 comprises a MEMS device having a flexible diaphragm 118 made of dielectric material corresponding to a dielectric layer 108. In this example, at least a portion of the flexible diaphragm 118 can move, or oscillate vertically with respect to the MEMS IC 102 when stimulated by an external environment. In some embodiments, the flexible diaphragm 118 and the dielectric layer 108 are disposed over a MEMS substrate 106. The MEMS substrate 106 can be a bulk substrate comprising silicon, germanium, silicon carbide or III-V group material. An opening 120 is disposed within the MEMS substrate 106, vertically aligned with the diaphragm 118. The MEMS IC 102 further comprises a piezoelectric layer 110 disposed over the flexible diaphragm 118 and the dielectric layer 108. In some embodiments, the piezoelectric layer 110 can comprise piezoelectric material such as AlN (aluminum nitride), PZT (Pb(Zr,Ti)O$_3$), ZnO (Zinc Oxide), etc. The piezoelectric layer 110 is configured to sense a motion of the diaphragm 118 and convert the motion to an electrical signal through a bottom electrode 124 and a top electrode 126. The bottom electrode 124 is disposed between the dielectric layer 108 and the piezoelectric layer 110 and the top electrode 126 is disposed on the piezoelectric layer 110. In some embodiments, a piezoelectric layer opening 122 is disposed at a position vertically aligned with the diaphragm 118, to expose at least a portion of the diaphragm 118 to a back cavity 140 between the MEMS IC 102 and the CMOS IC 104.

In some embodiments, a support layer 112 is disposed over a front side 130 of the CMOS IC 104, having an support layer opening 128 vertically aligned with the diaphragm 118. In some embodiments, the support layer 112 can be a substrate made of bulk material, such as bulk silicon and can be bonded to the CMOS IC 104, using fusion bonding for example. The support layer 112 can be bonded to a fusion bond layer, which can comprise SiO$_2$. In some embodiments, the CMOS IC 104 is thinned down to reduce the thickness thereof after fusion bonding. In some embodiments, the support layer opening 128 of the support layer 112 can be a through opening as shown that exposes a portion of the front side 130 of the CMOS IC 104 while in some other embodiments, the support layer opening 128 does not pinch off the support layer 112 as long as the support layer opening 128 has an applicable height h. The height h of the support layer opening 128 depends on the application. In some embodiments, the height h of the support layer 112 can be in a range of from about 20 µm to about 250 µm.

In some embodiments, the MEMS IC 102 further comprises highly-doped semiconductor pillars 138. The highly-doped semiconductor pillars 138 can be a portion of the MEMS substrate 106. The highly-doped semiconductor pillars 138 can be separated from the MEMS substrate 106 by a surrounding dielectric material 142. In some embodiments, a trench 148 is disposed within the dielectric material 142, due to imperfect filling. The trench 148 can be filled by a poly material, which has a better filling character than the dielectric material 142. As shown in FIG. 1, a first highly doped semiconductor pillar 138a is disposed at one side of the opening 120, connecting to the bottom electrode 124 by a conductive via 144 such as a tungsten via disposed through the dielectric layer 108, and a second highly doped semiconductor pillar 138b is disposed at the other side of the opening 120, connecting to the top electrode 126. Metal contacts 146 can be disposed on the highly doped semiconductor pillars 138 at a back side 134 of the MEMS IC 102.

Figure 2:
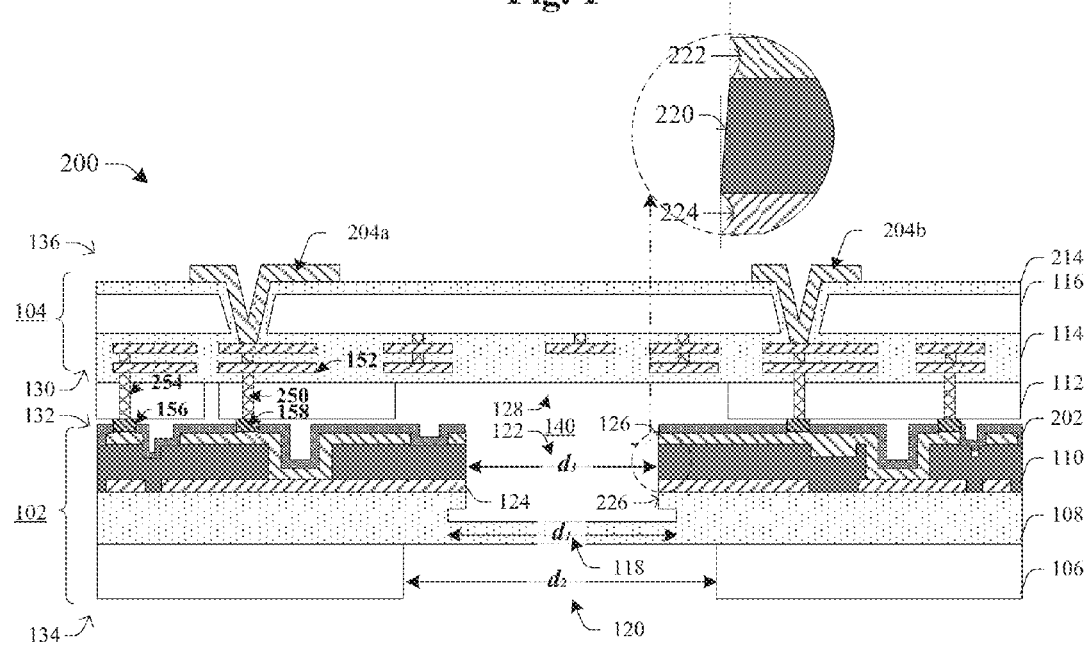
FIG. 2 illustrates a cross-sectional view of some other embodiments of a MEMS package.

FIG. 2 shows a cross-sectional view of a MEMS package 200 according to some other embodiments. As shown in FIG. 2, the MEMS package 200 comprises a MEMS IC 102 and a CMOS IC 104 that are bonded together at corresponding front sides 132, 130, enclosing a back cavity 140 over a flexible diaphragm 118. The MEMS IC 102 comprises a MEMS substrate 106 with an opening 120. The flexible diaphragm 118 is made of dielectric material corresponding to a dielectric layer 108 and disposed over an opening 120 of the MEMS substrate 106. A piezoelectric layer 110 with a piezoelectric layer opening 122 is disposed over the flexible diaphragm 118 and the dielectric layer 108, separating a top electrode 126 and a bottom electrode 124. In some embodiments, the MEMS IC 102 further comprises a VHF protective layer 202 covering the top electrode 126 and the piezoelectric layer 110, configured to protect the top electrode 126 and the piezoelectric layer 110 from a vapor hydrofluoric acid employed during the process.

In some embodiments, a lateral dimension $d_3$ of the piezoelectric layer opening 122 is smaller than a lateral dimension $d_1$ of the diaphragm 118. Or in other words, the piezoelectric layer 110 is disposed directly above at least a portion of the diaphragm 118, configured to sense the motion of the diaphragm. In some embodiments, an inner sidewall 226 of the dielectric layer 108 is aligned with a sidewall of the piezoelectric layer opening 122. In some embodiments, the opening 120 of the MEMS substrate 106 has a lateral dimension $d_2$ greater than $d_1$, the lateral dimension of the diaphragm 118. As shown in FIG. 2's inset, in some embodiments, a sidewall 220 of the piezoelectric layer 110 is tapered and adjacent to a sidewall 224 of the bottom electrode 124 and a sidewall 222 of the top electrode 126. The sidewalls 222, 224 respectively have central portions recessed back with relative to the sidewall 220 of the piezoelectric layer 110.

In some embodiments, a support layer 112 is disposed over the front side 130 of the CMOS IC 104, having a support layer opening 128 vertically aligned with the diaphragm 118, as a part of the back cavity 140. The support layer 112 is attached to the CMOS IC 104 with the support layer opening 128 in place to provide sufficient back cavity 140 for the operation of the diaphragm 118 while not consuming an effective area of an electrical interconnect structure 114 of the CMOS IC 104 disposed underneath. In some embodiments, the support layer 112 can be a bulk substrate bonded to the CMOS IC 104. In some embodiments, an inner metal layer 250 is disposed through the support layer 112 at a position closer to the support layer opening 128 relative to an outer metal layer 254, which is also disposed through the support layer 112. The inner metal layer 250 connects a metal interconnect layer 152 of the electrical interconnect structure 114 of the CMOS IC 104 and a metal pad 158. The metal pad 158 can be connected to the bottom electrode 124 or the top electrode 126. The outer metal layer 254 connects a metal interconnect layer of the electrical interconnect structure 114 to a bonding pad 156. The bonding pad 156 can be eutectic bonded to a corresponding bond pad attached to the MEMS IC 102. In some embodiments, the inner and outer metal layers 250, 254 are straight vias made of tungsten, while in some other embodiments, the inner and outer metal layers 250, 254 can be a conformal metal layer made of aluminum or copper and disposed along sidewalls of tapered trenches through the support layer 112 and extended over an upper surface of the support layer 112 (as shown in FIG. 1).

In some embodiments, through substrate vias (TSVs) 204a, 204b are disposed through a CMOS substrate 116 of the CMOS IC 104 and extended over a back side 136 of the CMOS IC 104. The TSVs 204a, 204b can be connected to CMOS devices (e.g., a transistor) of the CMOS IC 104. In some embodiments, the TSVs 204a, 204b can be connected to bottom or top electrodes 124, 126 by metal interconnect layers and via interconnects disposed within the electrical interconnect structure 114. A dielectric layer 214 can be disposed between the TSVs 204 and the CMOS substrate 116, along sidewalls of vias and a back surface of the CMOS substrate 116. The CMOS substrate 116 is typically planar with a substantially uniform thickness. Further, the CMOS substrate 116 is n or p type, and can, for example, be a silicon wafer, such as a Si bulk wafer or a silicon-on-insulator (SOI) wafer. If present, an SOI substrate is often made up of an active layer of high quality silicon, which is arranged over a handle wafer and is separated from the handle wafer by a buried oxide layer. In some other embodiments, the semiconductor substrate can also be a sapphire substrate, a binary compound substrate (e.g. a III-V substrate), or other higher order compound substrate, with or without additional insulating or conducting layers formed thereover, among others.

Figure 3:
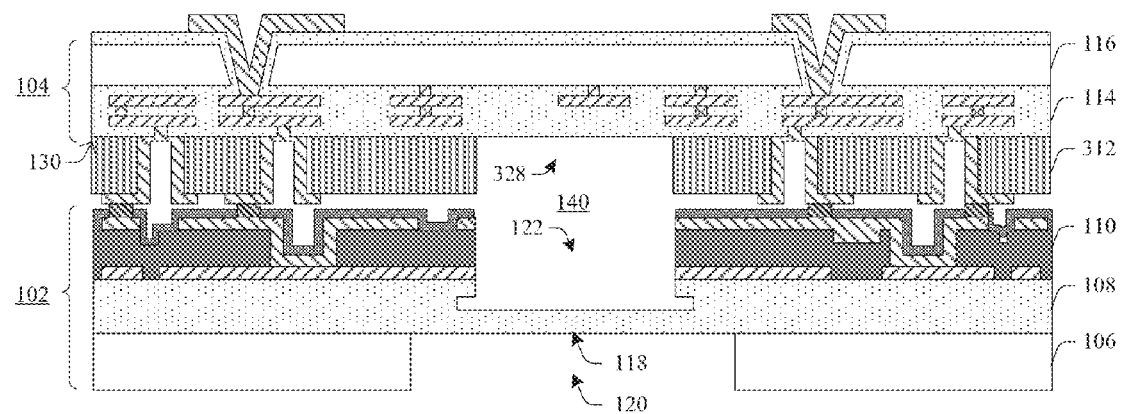
FIG. 3 illustrates a cross-sectional view of some other embodiments of a MEMS package.

FIG. 3 shows a cross-sectional view of a MEMS package 300 according to some other embodiments. As shown in FIG. 3, a support layer 312 can be disposed over a CMOS IC 104. In this embodiment, the support layer 312 can be a thick organic film attached to the CMOS IC 104. For examples, the support layer 312 can comprise a photoresist material such as polyimide, SU-8, PMMA, etc. In some embodiments, the support layer 312 can be a photoresist mareial that is coated (e.g. spun) on a front side 130 of the CMOS IC 104 and then baked. The support layer 312 has a support layer opening 328 within the support layer 312 that can be formed at a position directly above a flexible diaphragm 118.

Figure 4:
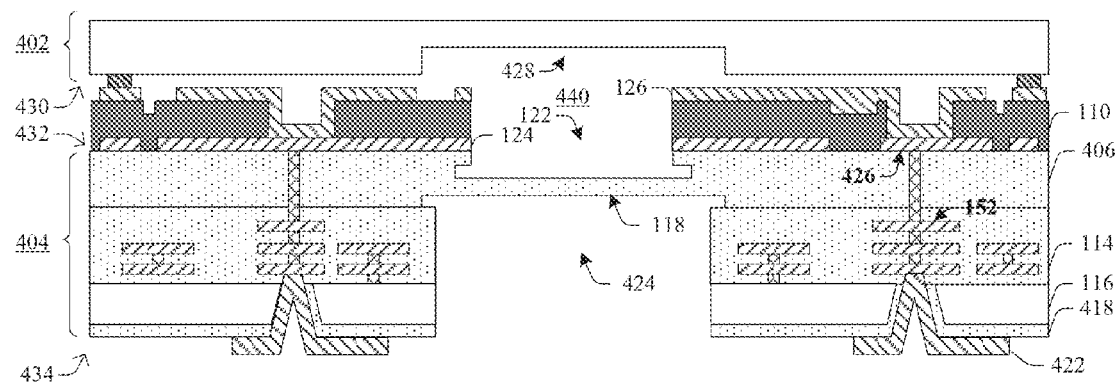
FIG. 4 illustrates a cross-sectional view of some other embodiments of a MEMS package.

FIG. 4 shows a cross-sectional view of a MEMS package 400 according to some other embodiments. As shown in FIG. 4, the MEMS package 400 comprises a CMOS IC 404 comprising an electrical interconnect structure 114 disposed over a CMOS substrate 116 having a plurality of metal layers disposed within a first inter-layer dielectric (ILD) layer. A flexible diaphragm 118 is made of dielectric material corresponding to a second dielectric layer 406 and disposed over the electrical interconnect structure 114. A piezoelectric layer 110 is disposed over the flexible diaphragm 118, and the second dielectric layer 406 and top and bottom electrodes 126, 124 are respectively disposed at upper and lower surfaces of the piezoelectric layer 110. In some embodiments, the top electrode 126 is extended along a sidewall of a piezoelectric layer opening and is coupled to a metal pad 426 extending under the piezoelectric layer 110. The metal pad 426 can be connected to an metal interconnect layer 152 of the electrical interconnect structure 114 and further connected to an active device of the CMOS IC 404 and/or a TSV contact 422 disposed at a back side 434 of the CMOS IC 404. The CMOS IC 404 comprises an opening 424 through the CMOS substrate 116 and the electrical interconnect structure 114, exposing the flexible diaphragm 118 to the ambient environment to receive stimuli. The MEMS package 400 further comprises a cap substrate 402 bonded to the CMOS IC 404 at a front side 432 via a eutectic bond. In some embodiments, the cap substrate 402 is bonded to the CMOS IC 404 by a semiconductor-to-metal bonding between a semiconductor material and a metal material. In some embodiments, the semiconductor material includes at least one of Ge, Si, SiGe or another semiconductor material. In some embodiments, the metal material includes at least one of aluminum (Al), copper (Cu), titanium (Ti), tantalum (Ta), gold (Au), nickel (Ni), tin (Sn) or another metal. An cap substrate opening 428 is disposed at a front side 430 of the cap substrate 402 at a position vertically aligned with the flexible diaphragm 118. The bonding of the CMOS IC 404 and the cap substrate 402 encloses the cap substrate opening 428 and a piezoelectric layer opening 122, forming a back cavity 440 over the flexible diaphragm 118 to improve performance of a MEMS device of the MEMS package 400.

Figure 5:
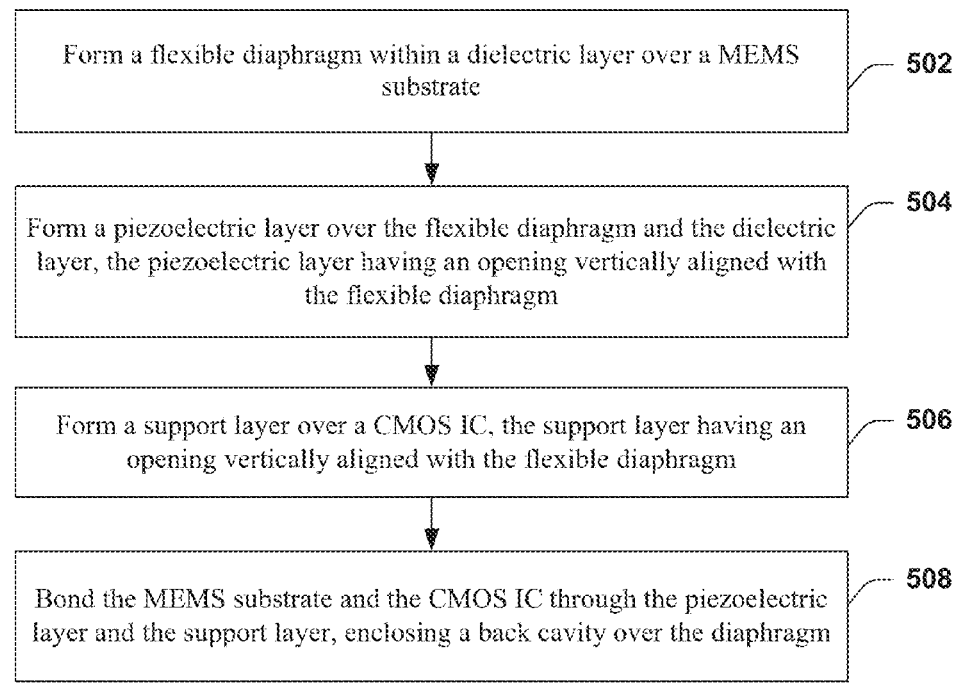
FIG. 5 illustrates a flow chart of some embodiments of a method for manufacturing a MEMS package.

FIG. 5 shows a flow diagram of a method 500 for manufacturing a MEMS package according to some embodiments. Examples of the MEMS package are shown in FIGS. 1-3. The MEMS package is formed by bonding two ICs (e.g. a CMOS IC, a MEMS IC, or a cap substrate) together, enclosing a sufficient back cavity for a flexible diaphragm. Advantageously, the MEMS package can be formed by a wafer level bonding followed by a singulation process to form individual packages. Wafer-level formation and improved connection approaches (such as TSVs or through metal layers that extend over a surface) reduce parasitic capacitances between MEMS devices and the corresponding IC devices. In some embodiments, a support layer can either bonded or coated between the two ICs prior to the bonding, forming an opening therein to provide sufficient back cavity without consuming effective areas of the bonded ICs.

While disclosed methods (e.g., method 500, 600, 1900, 3300 and 3900 hereafter) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 502, a flexible diaphragm is formed with dielectric material corresponding to a dielectric layer over a semiconductor substrate.

At act 504, a piezoelectric layer is formed and patterned over the flexible diaphragm and the dielectric layer to form a MEMS IC. The piezoelectric layer has an opening vertically aligned with the flexible diaphragm.

At act 506, a support layer is formed over a CMOS IC. An opening is formed at a front side of the support layer, vertically aligned with the flexible diaphragm. In some embodiments, the support layer can be formed by fusion bonding a semiconductor substrate to the CMOS IC. In some other embodiments, the support layer can be formed by coating a thick organic film on the CMOS IC.

At act 508, the MEMS IC and the CMOS IC are bonded together through the piezoelectric layer and the support layer, enclosing a back cavity over the diaphragm.

Figure 6:
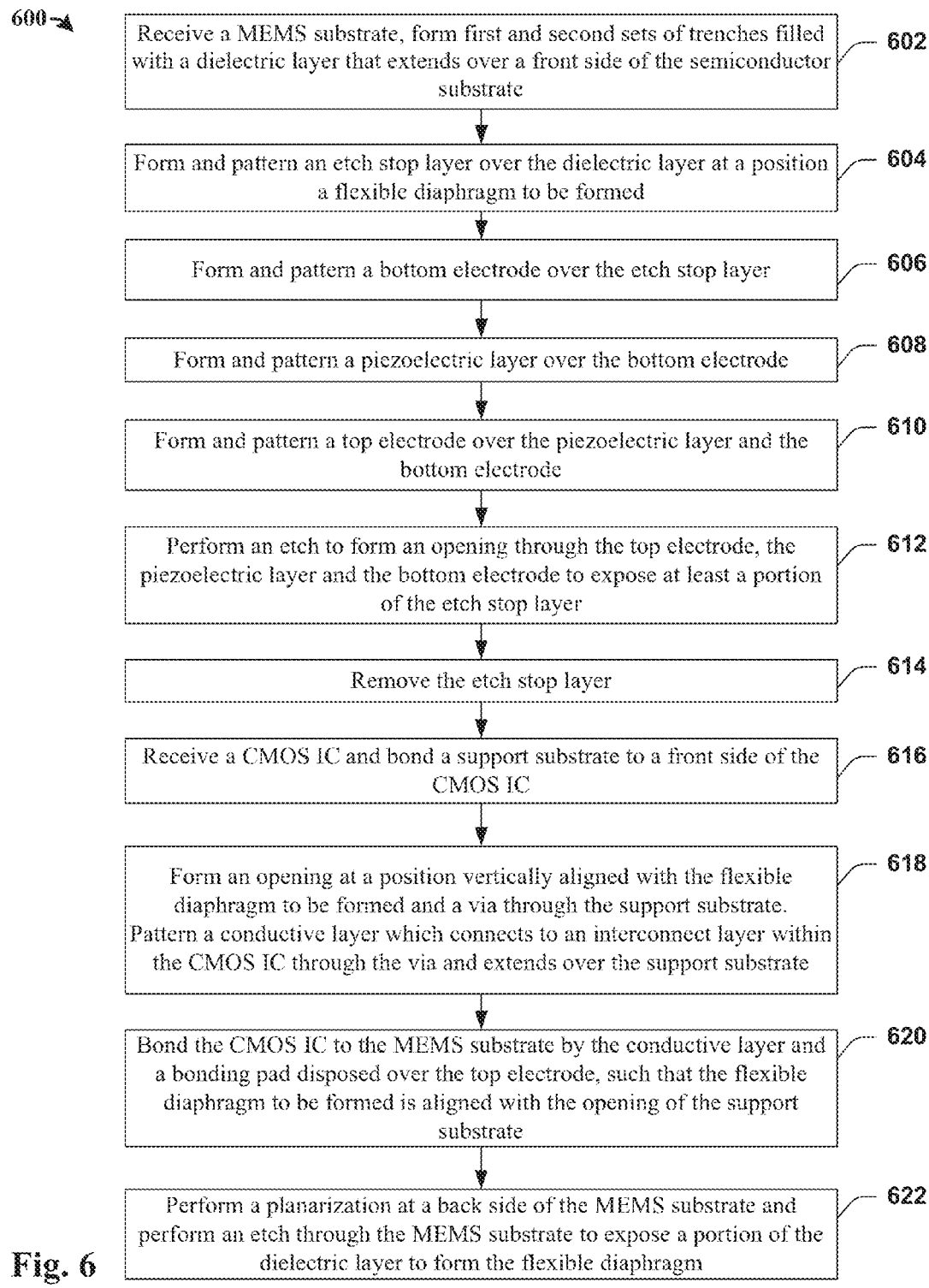
FIG. 6 illustrates a flow chart of some embodiments of a method for manufacturing a MEMS package.

FIG. 6 shows a flow diagram of a method 600 for manufacturing a MEMS package according to some embodiments. An example of the MEMS package is shown in FIG. 1.

At act 602, a MEMS substrate is received and first and second sets of trenches are formed. The first and second sets of trenches are then filled with a dielectric layer that extends over a front side of the MEMS substrate.

At act 604, an etch stop layer is formed and patterned over the dielectric layer at a position where a flexible diaphragm is to be formed.

At act 606, a bottom electrode is formed and patterned over the etch stop layer.

At act 608, a piezoelectric layer is formed and patterned over the bottom electrode.

At act 610, a top electrode is formed and patterned over the piezoelectric layer and the bottom electrode.

At act 612, an etch is performed to form an opening through the top electrode, the piezoelectric layer and the bottom electrode to expose at least a portion of the etch stop layer.

At act 614, the etch stop layer is removed.

At act 616, a CMOS IC is received and a support substrate is bonded to a front side of the CMOS substrate.

At act 618, an opening is formed at a position vertically aligned with the flexible diaphragm to be formed, and vias are formed through the support substrate. A conductive layer is formed and patterned to connect an interconnect layer within the CMOS IC through the vias and extends over the support substrate.

At act 620, the CMOS IC is bonded to the semiconductor substrate by the conductive layer and a bonding pad disposed over the top electrode, such that the flexible diaphragm to be formed is aligned with the opening of the support substrate.

At act 622, a planarization is performed at a back side of the semiconductor substrate and an etch is performed through the semiconductor substrate to expose a portion of the dielectric layer to form the flexible diaphragm.

FIGS. 7-18 show a series of cross-sectional views that collectively depict formation of a MEMS package according to some embodiments. Although FIGS. 7-18 are described in relation to the method 600, it will be appreciated that the structures disclosed in FIGS. 7-18 are not limited to the method 600, but instead may stand alone as structures independent of the method 600. Similarly, although the method 600 is described in relation to FIGS. 7-18, it will be appreciated that the method 600 is not limited to the structures disclosed in FIGS. 7-18, but instead may stand alone independent of the structures disclosed in FIGS. 7-18.

Figure 7:
FIGS. 7-18 illustrate a series of cross-sectional views of some embodiments of a MEMS package at various stages of manufacture.

FIG. 7 shows a cross-sectional view 700 corresponding to act 602 according to some embodiments. As shown in FIG. 7, a MEMS substrate 106 is received having a front side 708 and a back side 134. The MEMS substrate 106 can be prepared from a bulk semiconductor wafer including, for example, a monocrystalline or single crystalline silicon wafer, or another substrate made of germanium, silicon carbide, a group III element, and/or a group V element, for example. In some embodiments, first and second sets of trenches 702a, 702b are formed in the front side 708 of the MEMS substrate 106, respectively surrounding first and second portions 706a and 706b of the MEMS substrate 106. The trenches 702 are filled with a ring of first dielectric material 142. In some embodiments, smaller trenches 148 are formed within the first dielectric layer 142 and filled with a polysilicon material 704. The polysilicon material 704 is then planarized, for example, applying a chemical mechanical polishing (CMP) process. The first and second portions 706 of the MEMS substrate 106 are then prepared (e.g. doped) to provide electrical connection for a MEMS device. Though not shown in FIG. 7, the MEMS substrate 106 may be prepared with other patterning processes. For example, alternatively, a TSV opening can be formed at this step or later to prepare for a contact at the back side 134 of the MEMS substrate 106 to electrically couple the MEMS device.

Figure 8:
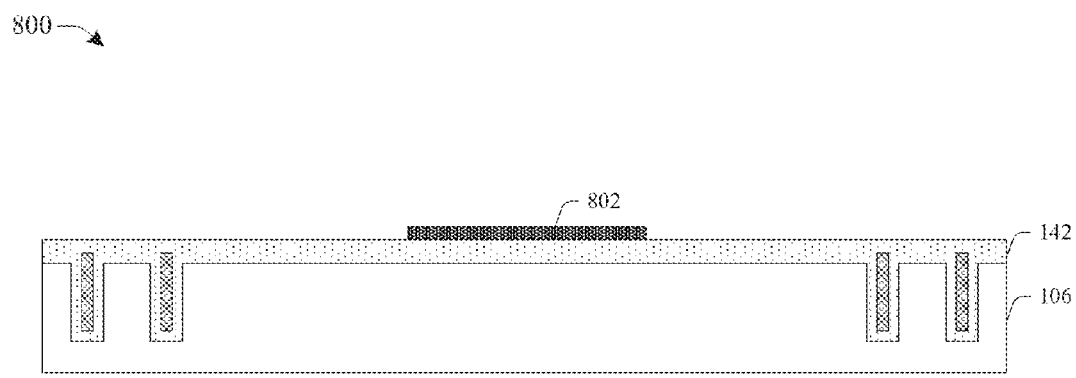

FIG. 8 shows a cross-sectional view 800 corresponding to act 604 according to some embodiments. As shown in FIG. 8, an etch stop layer 802 is formed and patterned at a position over the first dielectric layer 142 where a flexible diaphragm to be formed. The etch stop layer 802 can comprise applicable material having high etching selectivity relative to the first dielectric layer 142, such as oxide material. Example materials of the etch stop layer 802 include germanium, aluminum, copper, polysilicon, etc. In some embodiments, the first dielectric layer 142 is thickened before forming the etch stop layer 802. A thickness of the first dielectric layer 142 to an upper surface of the MEMS substrate 106 is substantially a thickness of the flexible diaphragm to be formed.

Figure 9:
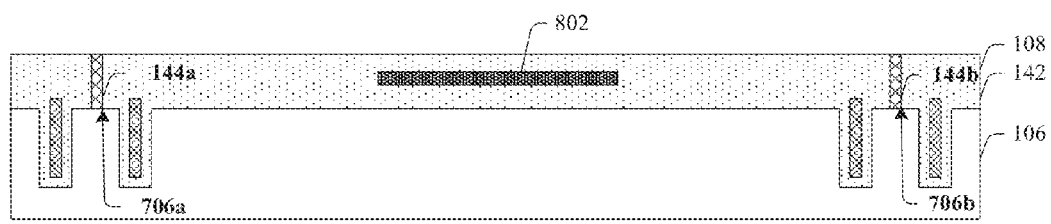
Figure 10:
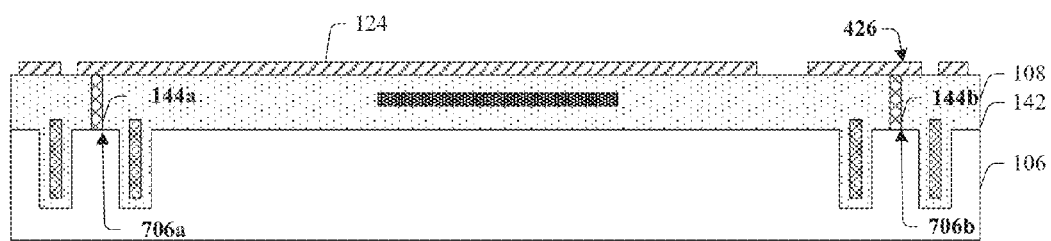

FIGS. 9-10 show cross-sectional views 900 and 1000 corresponding to act 606 according to some embodiments. As shown in FIG. 9, a second dielectric layer 108 is formed over the etch stop layer 802 and the first dielectric layer 142. In some embodiments, the second dielectric layer 108 is made of same material as of the first dielectric layer 142. Conductive vias 144 are formed through the first and second dielectric layers 142, 108 and are separately coupled to the first and second portions 706 of the MEMS substrate 106. As shown in FIG. 10, a bottom electrode layer is formed and patterned over the etch stop layer 802 and the second dielectric layer 108. In some embodiments, the bottom electrode layer is patterned to form a bottom electrode 124 separated from a first connection pad 426. In some embodiments, the bottom electrode 124 touches a first conductive via 144a and the first connection pad 426 touches a second conductive via 144b. In some embodiments, the conductive vias 144 can be tungsten plugs.

Figure 11:
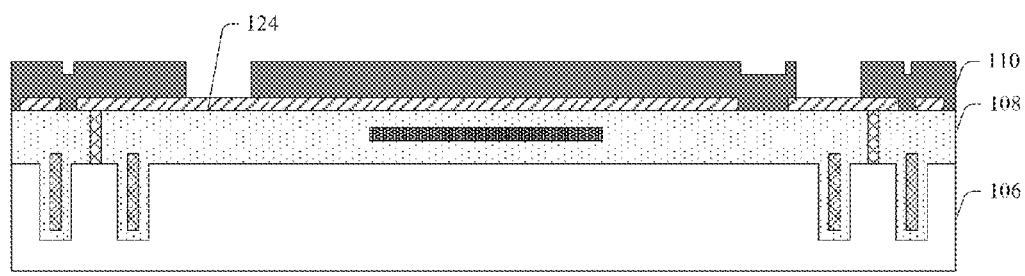

FIG. 11 shows a cross-sectional view 1100 corresponding to act 608 according to some embodiments. As shown in FIG. 11, a piezoelectric layer 110 is formed and patterned over the bottom electrode 124.

Figure 12:
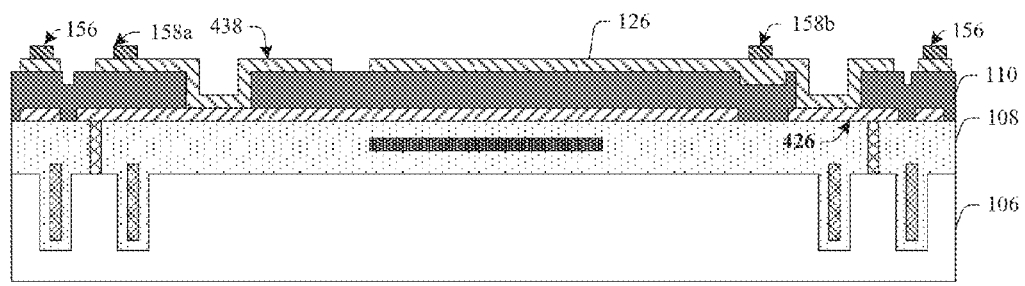

FIG. 12 shows a cross-sectional view 1200 corresponding to act 610 according to some embodiments. As shown in FIG. 12, a top electrode layer is formed and patterned over the piezoelectric layer 110 and the bottom electrode 124. In some embodiments, the top electrode layer is patterned to form a top electrode 126 separated from a second connection pad 438. In some embodiments, the top electrode 126 is coupled to the first connection pad 426 through the piezoelectric layer 110 and the bottom electrode 124 is coupled to the second connection pad 438 through the piezoelectric layer 110. In some embodiments, the MEMS substrate 106 then can be prepared for a bonding process. A bonding pad 156 can be formed over the top electrode layer as shown in FIG. 12, or the bonding pad 156 can also formed through openings of the top electrode layer and over the piezoelectric layer 110. The bonding pad 156 can be a rectangular or circular ring comprising metals or semiconductors such as aluminum (Al), germanium (Ge), gold (Au), copper (Cu), Tin (Sn) or alloys, formed at a periphery of the MEMS device. Some metal pads 158 can also be formed at an inner position relative to the bonding pad 156 to provide electrical connections.

Figure 13:
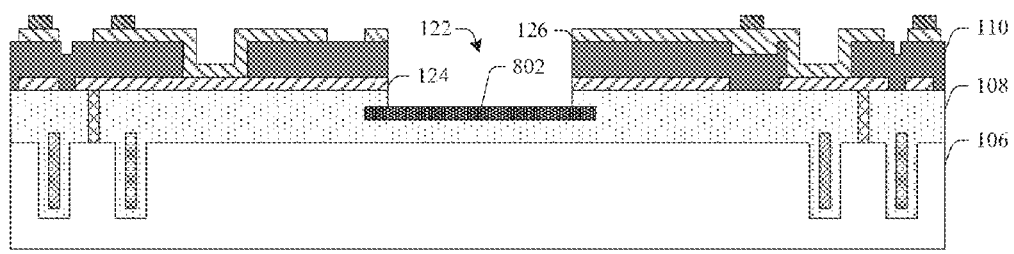

FIG. 13 shows a cross-sectional view 1300 corresponding to act 612 according to some embodiments. As shown in FIG. 13, an etch is performed to form an opening 122 through the top electrode 126, the piezoelectric layer 110, the bottom electrode 124 and a portion of the second dielectric layer 108 above the etch stop layer 802 to expose at least a portion of the etch stop layer 802.

Figure 14:
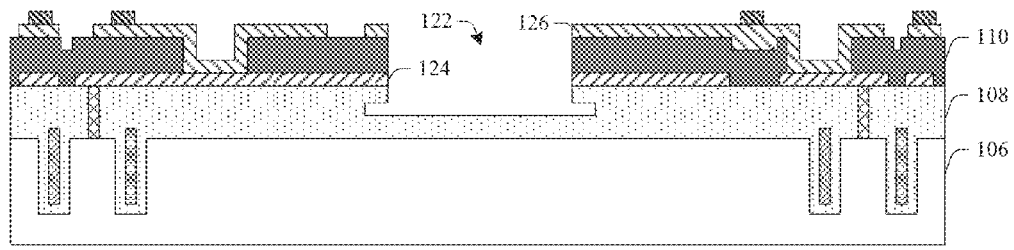

FIG. 14 shows a cross-sectional view 1400 corresponding to act 614 according to some embodiments. As shown in FIG. 14, the etch stop layer 802 is selectively removed.

Figure 15:
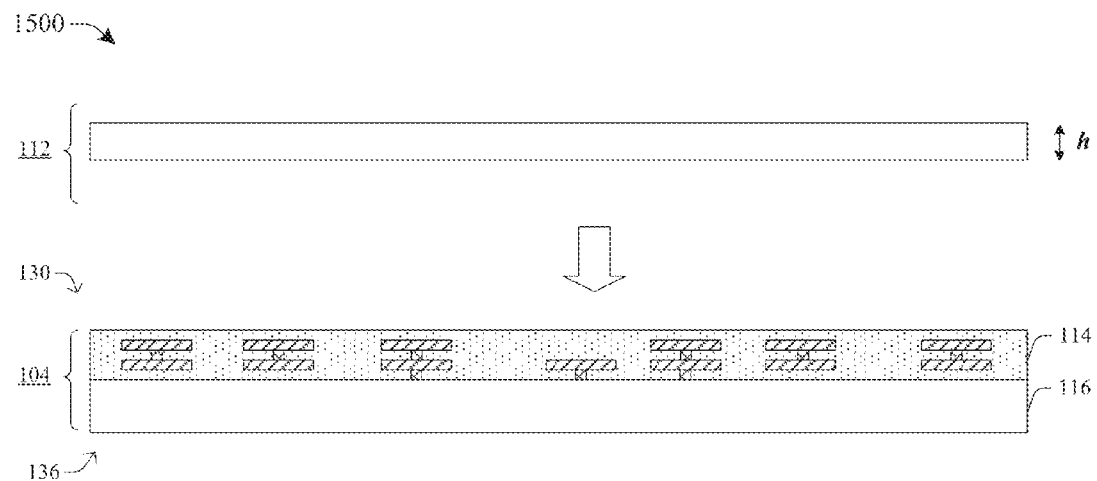

FIG. 15 shows a cross-sectional view 1500 corresponding to act 616 according to some embodiments. As shown in FIG. 15, a CMOS IC 104 is received and a support substrate 112 is bonded to a front side 130 of the CMOS IC 104. In some embodiments, the CMOS IC 104 has been prepared through one or more fabrication processes prior to the bonding. For example, the CMOS IC 104 includes one or more active elements. A series of metallization planes and via interconnects are disposed within an IMD layer 114 formed over an upper surface of a CMOS substrate 116. In some embodiments, the support substrate 112 and the CMOS IC 104 are bonded by fusion bonding between semiconductor material such as silicon and oxide material such as silicon oxide. The support substrate 112 has a height h, which varies depending on the application to provide a sufficient back cavity for the MEMS device. In some embodiments, the height h can be in a range of from about 20 μm to about 250 μm.

Figure 16:
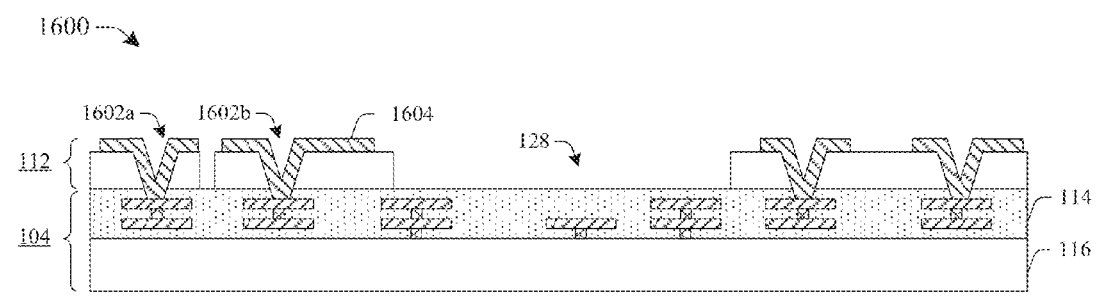

FIG. 16 shows a cross-sectional view 1600 corresponding to act 618 according to some embodiments. As shown in FIG. 16, the support substrate 112 can be thinned down. An opening 128 is formed at a position vertically aligned with the flexible diaphragm to be formed in the support substrate 112. Through substrate vias (TSVs) 1604 are formed through the support substrate 112 by patterning a conductive layer along sidewalls of through substrate openings 1602 and extend over a front surface of the support substrate 112. In some embodiments, TSVs 1604 connect to an interconnect layer within the CMOS IC 104. In some embodiments, TSVs 1604 are formed to be used for eutectic bonding to be performed.

Figure 17:
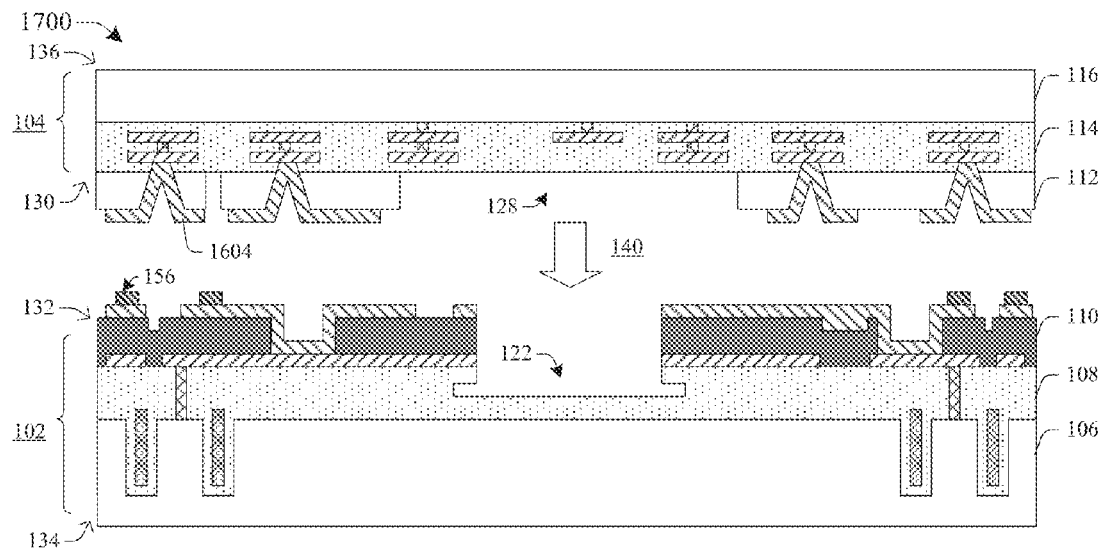

FIG. 17 shows a cross-sectional view 1700 corresponding to act 620 according to some embodiments. As shown in FIG. 17, the CMOS IC 104 is bonded to a MEMS IC 102 comprising the MEMS substrate 106 and a plurality of layers disposed thereon. In some embodiments, the CMOS IC 104 and the MEMS IC 102 are bonded through eutectic bonding between the bonding pad 156 and the TSVs 1604. A back cavity 140 is formed by enclosing the opening 128 of the support substrate 112 and the opening 122 of the MEMS IC 102 over the flexible diaphragm to be formed. In some embodiments, the MEMS IC 102 is bonded to the CMOS IC 104 by a semiconductor-to-metal bonding between a semiconductor material and a metal material. In some embodiments, the semiconductor material includes at least one of Ge, Si, SiGe or another semiconductor material. In some embodiments, the metal material includes at least one of aluminum (Al), copper (Cu), titanium (Ti), tantalum (Ta), gold (Au), nickel (Ni), tin (Sn) or another metal. In some other embodiments, the MEMS IC 102 is bonded to the CMOS IC 104 by eutectic bonding between two metal materials each including at least one of Al, Cu, Ti, Ta, Au, Ni, Sn, or another metal. The materials to be bonded are pressed against each other in an annealing process to form a eutectic phase of the materials. For example, a eutectic bonding between Ge and Al is formed at an annealing temperature in a range from 400° C. to 450° C.

Figure 18:
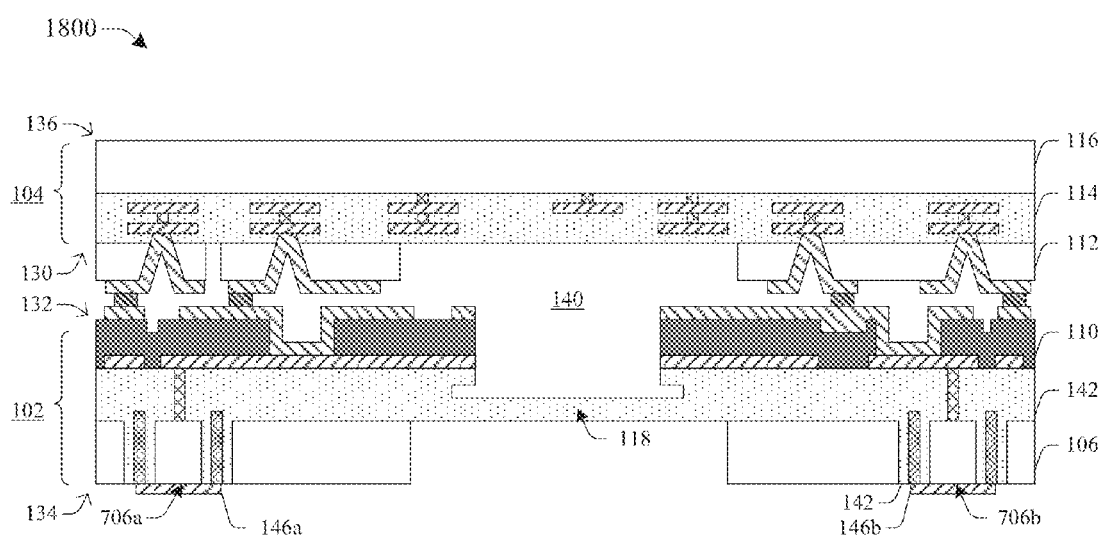

FIG. 18 shows a cross-sectional view 1800 corresponding to act 622 according to some embodiments. As shown in FIG. 18, a planarization such as a grinding is performed at a back side 134 of the MEMS substrate 106 to expose the first dielectric layer 142. Contacts 146a, 146b are then attached to the first and second portions 706a, 706b. An etch is preformed through the CMOS substrate 116 to expose a portion of the first dielectric layer 142 to form the flexible diaphragm 118.

Figure 19:
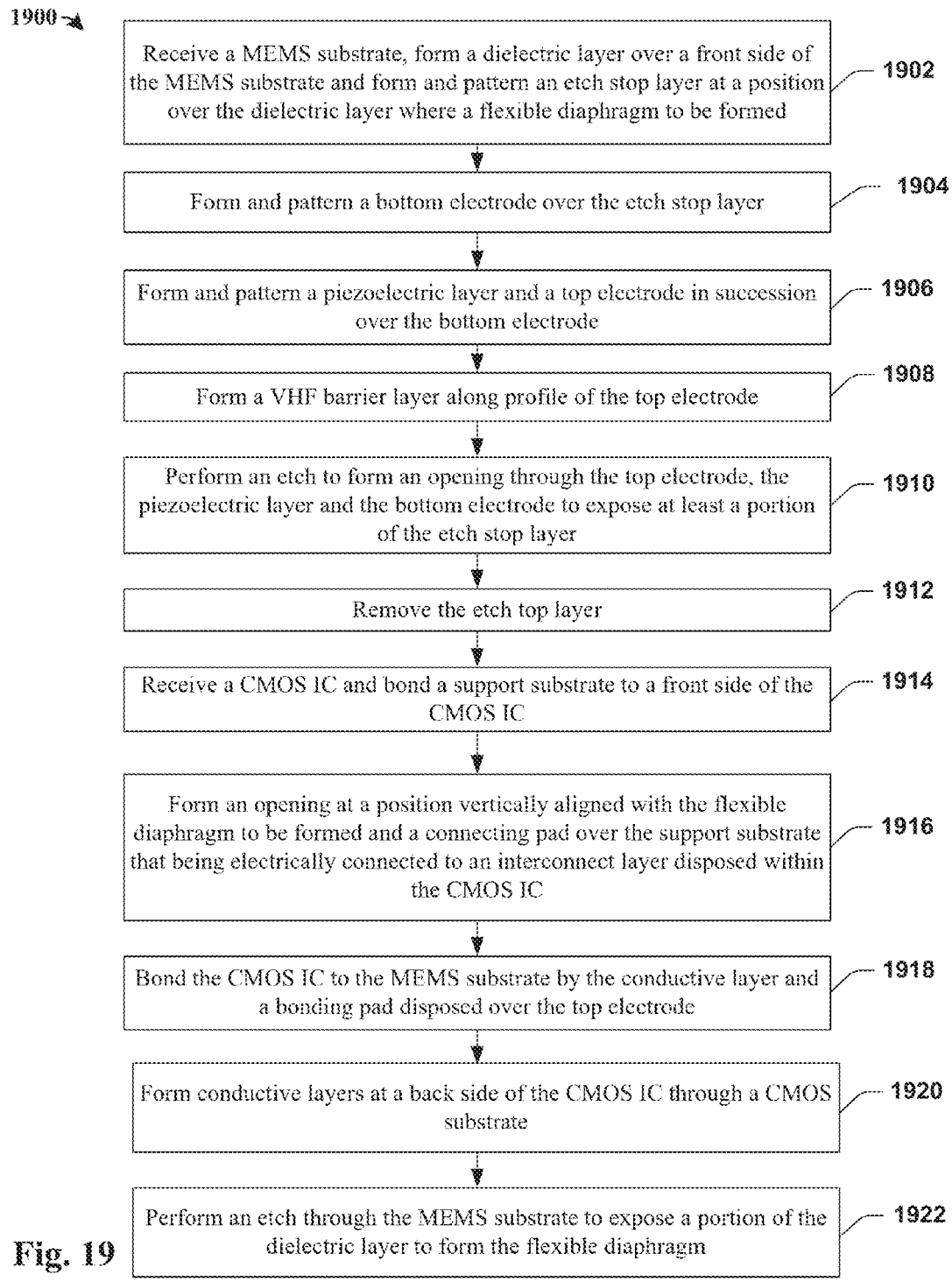
FIG. 19 illustrates a flow chart of some embodiments of a method for manufacturing a MEMS package.

FIG. 19 shows a flow diagram of a method 1900 for manufacturing a MEMS package according to some embodiments. An example of the MEMS package is shown in FIG. 2.

At act 1902, a MEMS substrate is received, a dielectric layer is formed over a front side of the MEMS substrate. An etch stop layer is formed and patterned at a position over the dielectric layer where a flexible diaphragm is to be formed.

At act 1904, a bottom electrode is formed and patterned over the etch stop layer.

At act 1906, a piezoelectric layer and a top electrode are formed and patterned over the bottom electrode.

At act 1908, a VHF barrier layer is formed along a profile of the top electrode.

At act 1910, an etch is performed to form an opening through the VHF barrier layer, the top electrode, the piezoelectric layer, and the bottom electrode to expose at least a portion of the etch stop layer.

At act 1912, the etch stop layer is removed.

At act 1914, a CMOS IC is received and a support substrate is bonded to a front side of the CMOS substrate.

At act 1916, an opening is formed at a position vertically aligned with the flexible diaphragm to be formed. Some vias are formed through the support substrate and a conductive layer is formed and patterned. The conductive layer connects to an interconnect layer within the CMOS IC through the vias and extends over the support substrate.

At act 1918, the CMOS IC is bonded to the MEMS substrate by the conductive layer and a bonding pad disposed over the top electrode, such that the flexible diaphragm to be formed is aligned with the opening of the support substrate.

At act 1920, conductive layers are formed on a back side of the CMOS IC through a CMOS substrate.

At act 1922, an etch is performed through the MEMS substrate to expose a portion of the dielectric layer to form the flexible diaphragm.

FIGS. 20-32 show a series of cross-sectional views that collectively depict formation of a MEMS package according to some embodiments. Although FIGS. 20-32 are described in relation to the method 1900, it will be appreciated that the structures disclosed in FIGS. 20-32 are not limited to the method 1900, but instead may stand alone as structures independent of the method 1900. Similarly, although the method 1900 is described in relation to FIGS. 20-32, it will be appreciated that the method 1900 is not limited to the structures disclosed in FIGS. 20-32, but instead may stand alone independent of the structures disclosed in FIGS. 20-32.

Figure 20:
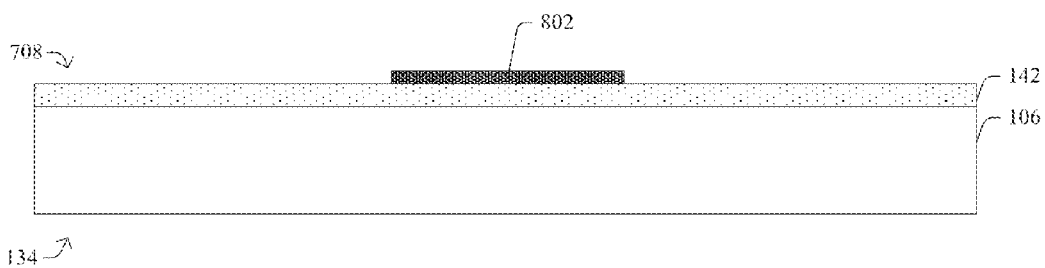
FIGS. 20-32 illustrate a series of cross-sectional views of some embodiments of a MEMS package at various stages of manufacture.

FIG. 20 shows a cross-sectional view 2000 corresponding to act 1902 according to some embodiments. As shown in FIG. 20, a MEMS substrate 106 is received having a front side 708 and a back side 134. An etch stop layer 802 is formed and patterned at a position over the first dielectric layer 142 where a flexible diaphragm is to be formed.

Figure 21:
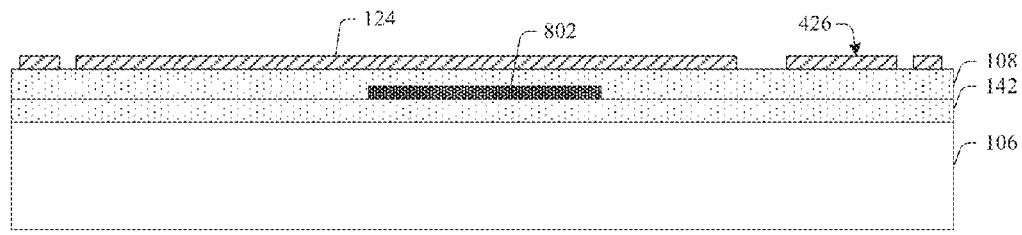

FIG. 21 shows a cross-sectional view 2100 corresponding to act 1904 according to some embodiments. As shown in FIG. 21, a second dielectric layer 108 is formed over the etch stop layer 802 and the first dielectric layer 142. A bottom electrode layer is formed over the second dielectric layer 108 and is patterned to form a bottom electrode 124 separated from a first connection pad 426.

Figure 22:
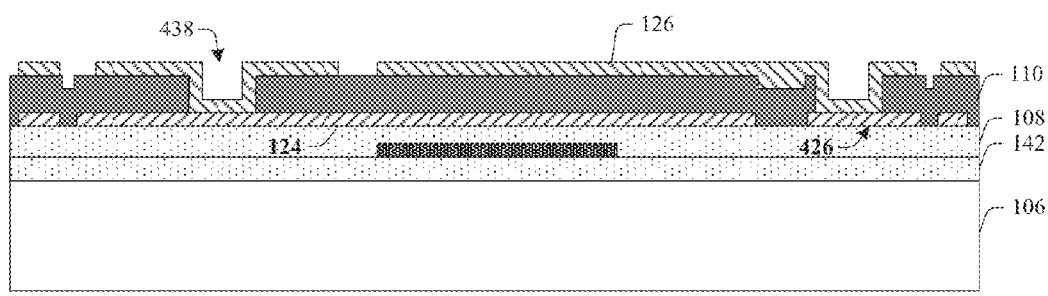

FIG. 22 shows a cross-sectional view 2200 corresponding to act 1906 according to some embodiments. As shown in FIG. 22, a piezoelectric layer 110 is formed and patterned over the bottom electrode layer. A top electrode layer is formed and patterned over the piezoelectric layer 110 and the bottom electrode layer. In some embodiments, the top electrode layer is patterned to form a top electrode 126 separated from a second connection pad 438. In some embodiments, the top electrode 126 is coupled to the first connection pad 426 through the piezoelectric layer 110 and the bottom electrode 124 is coupled to the second connection pad 438 through the piezoelectric layer 110.

Figure 23:
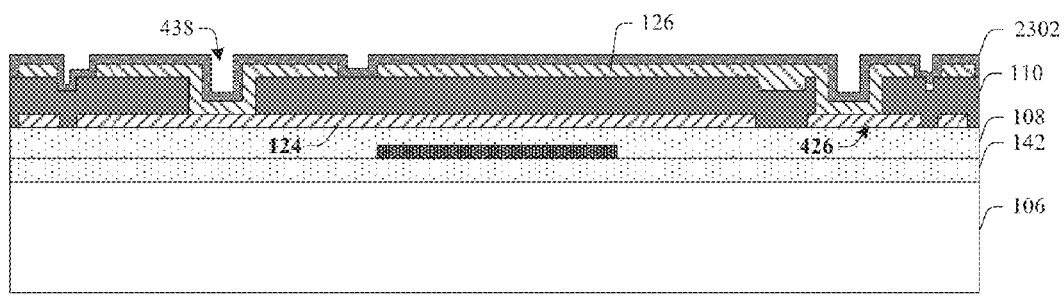

FIG. 23 shows a cross-sectional view 2300 corresponding to act 1908 according to some embodiments. As shown in FIG. 23, a VHF barrier layer 2302 is formed along a profile of the top electrode layer. In some embodiments, the VHF barrier layer 2302 is a conformal liner comprising nitride or oxide material such as $Si_3N_4$, $Si_2N_2O$, etc. The VHF barrier layer 2302 is relatively chemically inert, and resists etching by vapor hydrofluoric acid.

Figure 24:
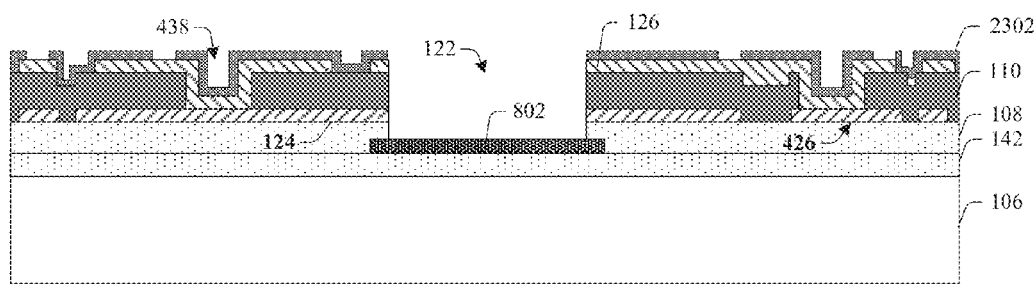

FIG. 24 shows a cross-sectional view 2400 corresponding to act 1910 according to some embodiments. As shown in FIG. 24, an etch is performed to form an opening 122 through the VHF barrier layer, the top electrode layer, the piezoelectric layer 110, the bottom electrode layer and a portion of the second dielectric layer 108 above the etch stop layer 802 to expose at least a portion of the etch stop layer 802.

Figure 25:
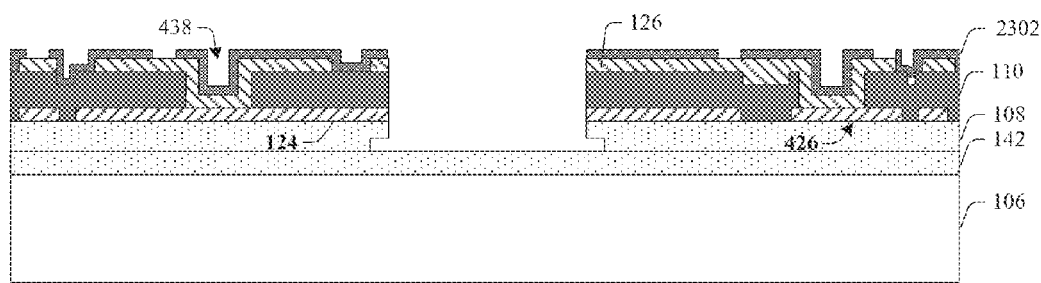

FIG. 25 shows a cross-sectional view 2500 corresponding to act 1912 according to some embodiments. As shown in FIG. 25, the etch stop layer 802 is selectively removed.

Figure 26:
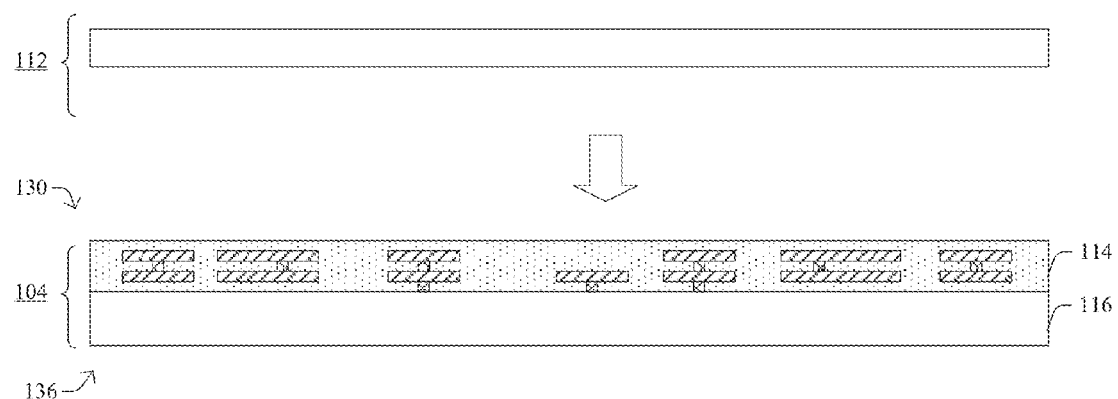

FIG. 26 shows a cross-sectional view 2600 corresponding to act 1914 according to some embodiments. As shown in FIG. 26, similar to FIG. 15, a CMOS IC 104 is received and a support substrate 112 is bonded to a front side 130 of the CMOS IC 104. In some embodiments, the support substrate 112 and the CMOS IC 104 are bonded by fusion bonding. The support substrate 112 has a height h, which varies depending on the application to provide a sufficient back cavity for the MEMS device. In some embodiments, the height h can be in a range of from about 20 µm to about 250 µm.

Figure 27:
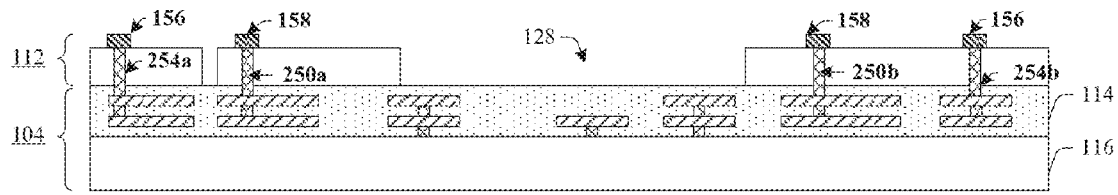

FIG. 27 shows a cross-sectional view 2700 corresponding to act 1916 according to some embodiments. As shown in FIG. 27, an opening 128 is formed at a position vertically aligned with the flexible diaphragm to be formed in the support substrate 112. Some inner metal layers 250 (e.g. 250a, 250b) and outer metal layers 254 (e.g. 254a, 254b) are formed through the support substrate 112. In some embodiments, the inner and outer metal layers 250, 254 can be vias made of tungsten. Some bonding pads 156 and additional metal pads 158 can be formed over the support substrate 112, attached to the inner and outer metal layers 250, 254. The bonding pads 156 can be a series separate pads or a continuous rectangular or circular ring comprising metals such as aluminum (Al), germanium (Ge), gold (Au), copper (Cu), Tin (Sn) or alloys, formed at a periphery of the MEMS device. The additional metal pads 158 can be made of the same material in the same process step with the bonding pads 156 and be formed at an inner position relative to the bonding pad 156 to provide electrical connections.

Figure 28:
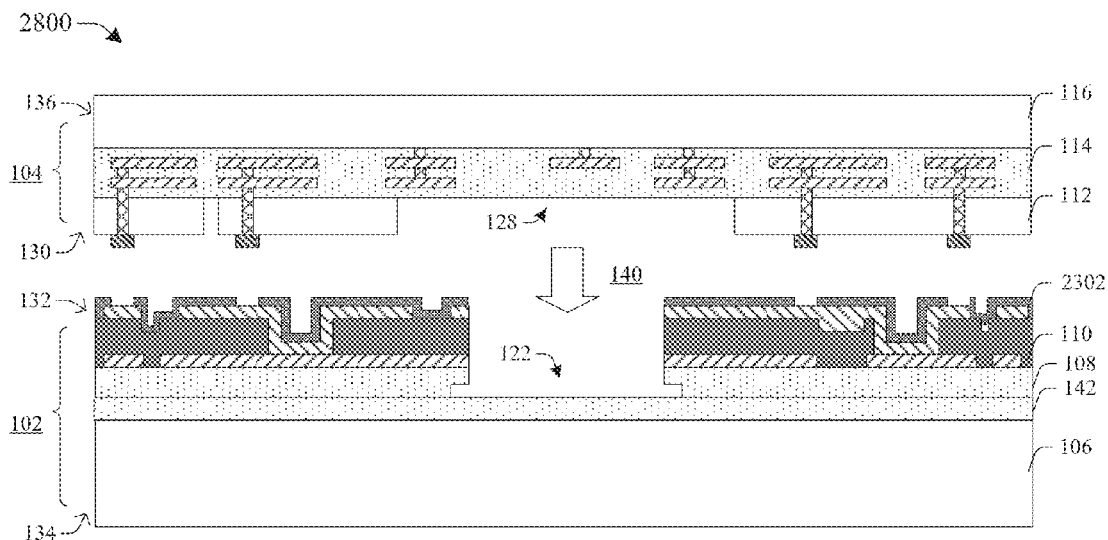

FIG. 28 shows a cross-sectional view 2800 corresponding to act 1918 according to some embodiments. As shown in FIG. 28, the CMOS IC 104 is bonded to a MEMS IC 102 comprising the MEMS substrate 106 and a plurality of layers disposed thereon. A back cavity 140 is formed by enclosing the opening 128 of the support substrate 112 and the opening 122 of the MEMS IC 102 over the flexible diaphragm to be formed.

Figure 29:
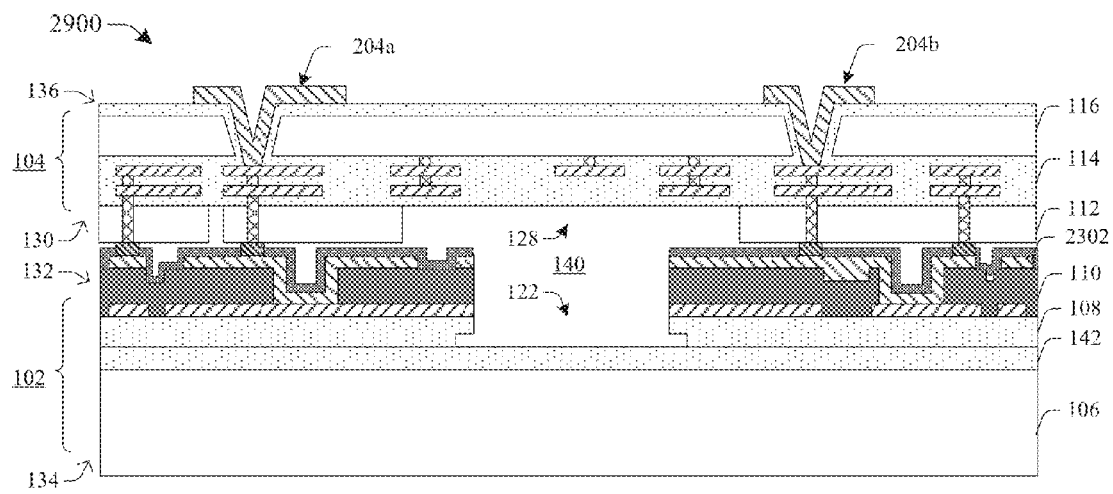

FIG. 29 shows a cross-sectional view 2900 corresponding to act 1920 according to some embodiments. As shown in FIG. 29, a CMOS substrate 116 is thinned down and conductive layers 204 (e.g. 204a, 204b) are formed on the back side 136 of the CMOS IC 104 through the CMOS substrate 116. In some embodiments, the conductive layers 204 are separately connected to metal layers of the electrical interconnect structure 114. The conductive layers 204 can also be coupled to the CMOS and/or MEMS devices disposed in the CMOS IC 104 and the MEMS IC 102.

Figure 30:
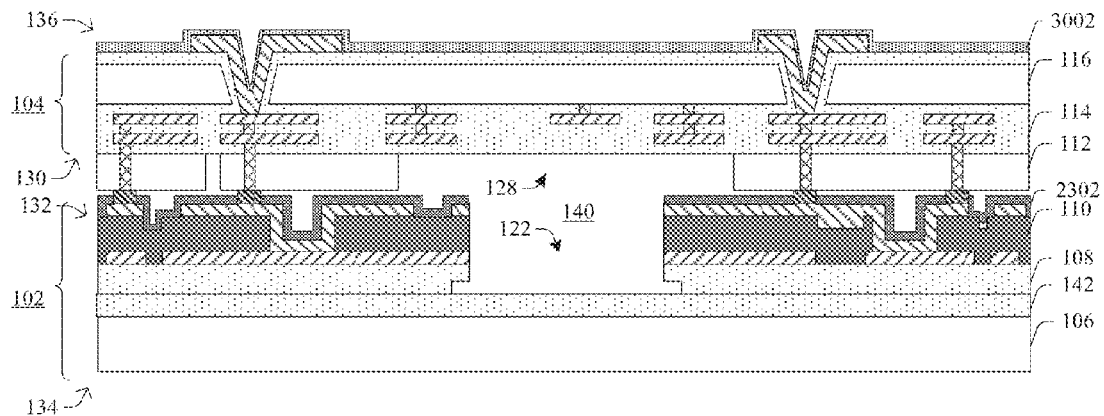
Figure 31:
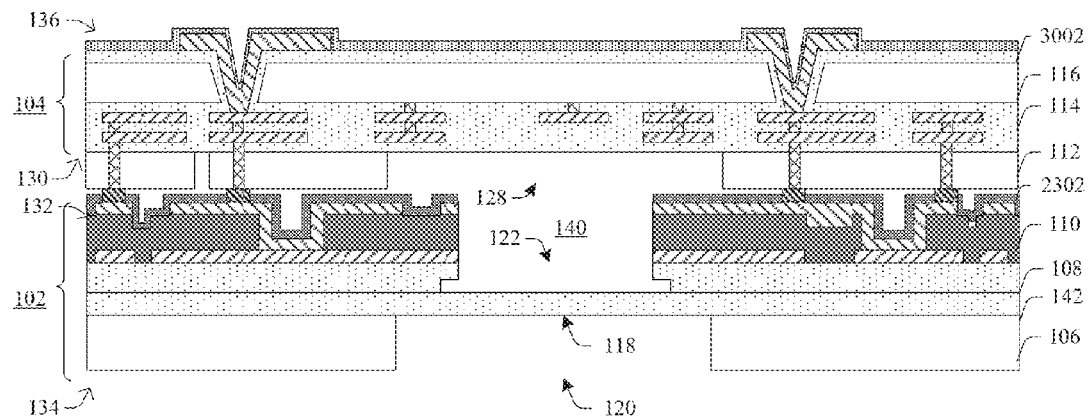
Figure 32:
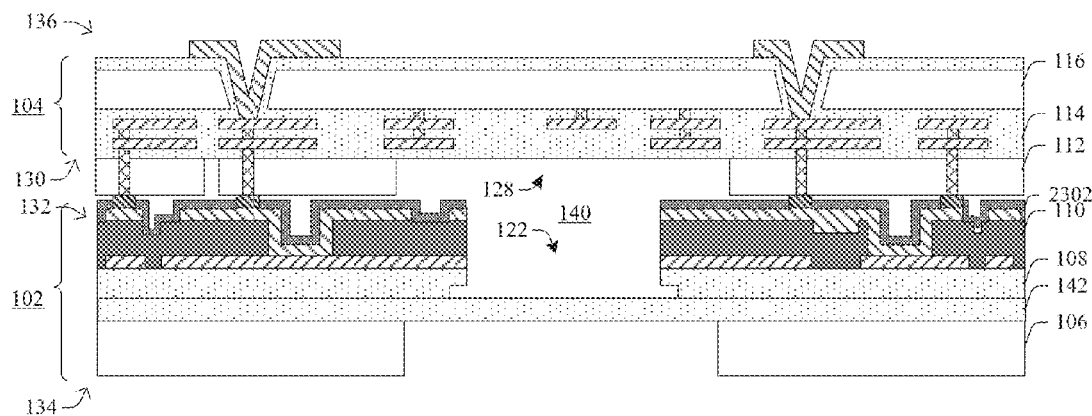

FIGS. 30-32 show cross-sectional views 3000, 3100 and 3200 corresponding to act 1920 according to some embodiments. As shown in FIG. 30, a photoresist material 3002 is coated to cover the back side 136 of the CMOS IC 104. The photoresist material 3002 is configured to protect the workpiece from subsequent etching steps. The MEMS substrate 106 is thinned down. As shown in FIG. 31, an etch is performed through the MEMS substrate 106 to expose a portion of the dielectric layer 142 to form the flexible diaphragm 118. As shown in FIG. 32, the photoresist material 3002 is removed after the etch.

Figure 33:
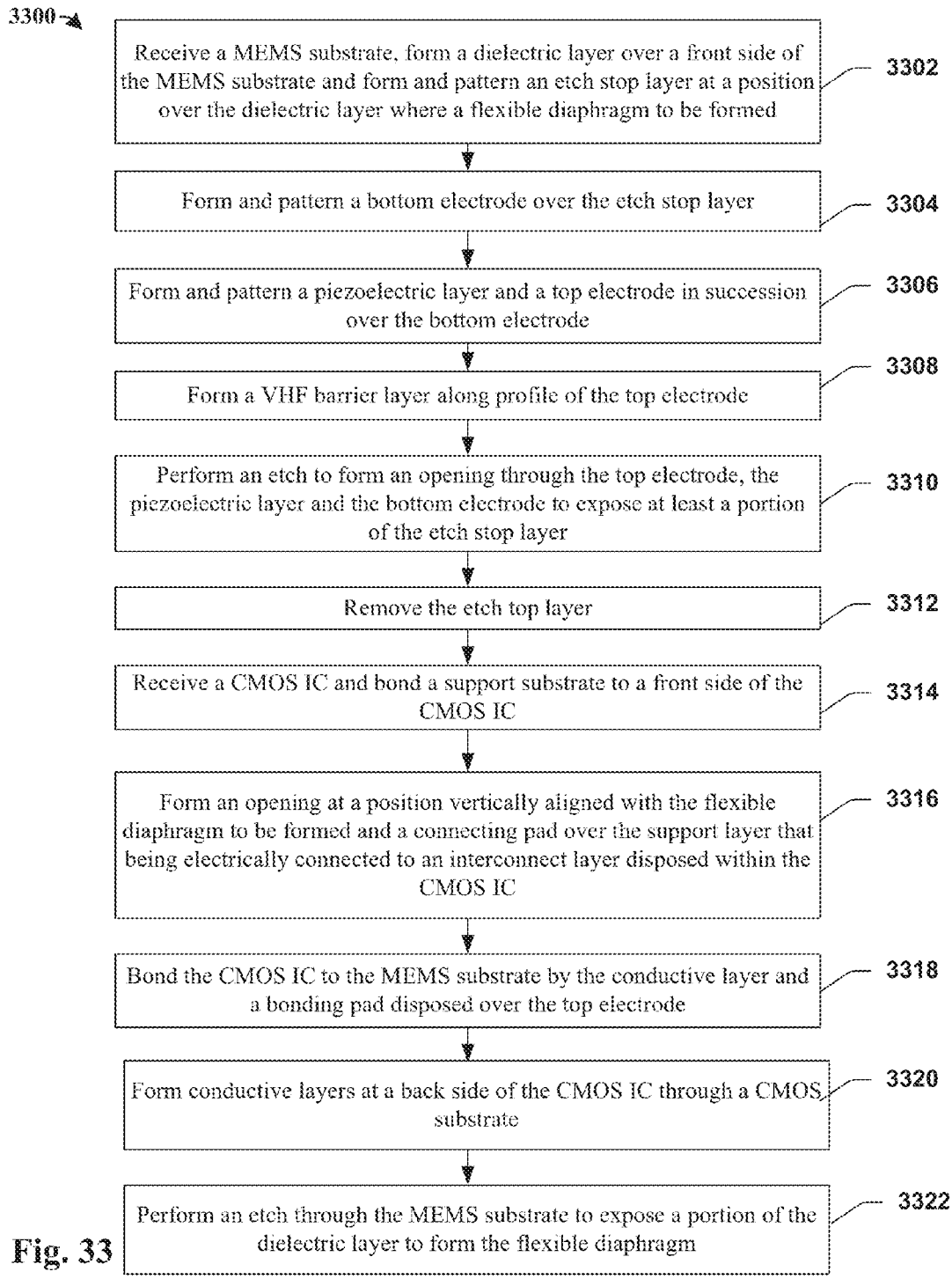
FIG. 33 illustrates a flow chart of some embodiments of a method for manufacturing a MEMS package.

FIG. 33 shows a flow diagram of a method 3300 for manufacturing a MEMS package according to some embodiments. An example of the MEMS package is shown in FIG. 3.

At act 3302, a MEMS substrate is received, and a dielectric layer is formed over a front side of the MEMS substrate. An etch stop layer is formed and patterned at a position over the dielectric layer where a flexible diaphragm to be formed.

At act 3304, a bottom electrode is formed and patterned over the etch stop layer.

At act 3306, a piezoelectric layer and a top electrode are formed and patterned over the bottom electrode.

At act 3308, a VHF barrier layer is formed along a profile of the top electrode.

At act 3310, an etch is performed to form an opening through the VHF barrier layer, the top electrode, the piezoelectric layer and the bottom electrode to expose at least a portion of the etch stop layer.

At act 3312, the etch stop layer is selectively removed.

At act 3314, a CMOS IC is received and a support layer is formed at a front side of a CMOS substrate.

At act 3316, an opening is formed at a position vertically aligned with the flexible diaphragm to be formed. Some vias are formed through the support layer and a conductive layer is patterned. The conductive layer connects to an interconnect layer within the CMOS IC through the vias and extends over the support layer.

At act 3318, the CMOS IC is bonded to the MEMS substrate by the conductive layer and a bonding pad disposed over the top electrode, such that the flexible diaphragm to be formed is aligned with the opening of the support layer.

At act 3320, conductive layers are formed on a back side of the CMOS IC through the CMOS substrate.

At act 3322, an etch is performed through the MEMS substrate to expose a portion of the dielectric layer to form the flexible diaphragm.

FIGS. 34-38 show a series of cross-sectional views that collectively depict formation of a MEMS package according to some embodiments. Although FIGS. 34-38 are described in relation to the method 3300, it will be appreciated that the structures disclosed in FIGS. 34-38 are not limited to the method 3300, but instead may stand alone as structures independent of the method 3300. Similarly, although the method 3300 is described in relation to FIGS. 34-38, it will be appreciated that the method 3300 is not limited to the structures disclosed in FIGS. 34-38, but instead may stand alone independent of the structures disclosed in FIGS. 34-38.

Figure 34:
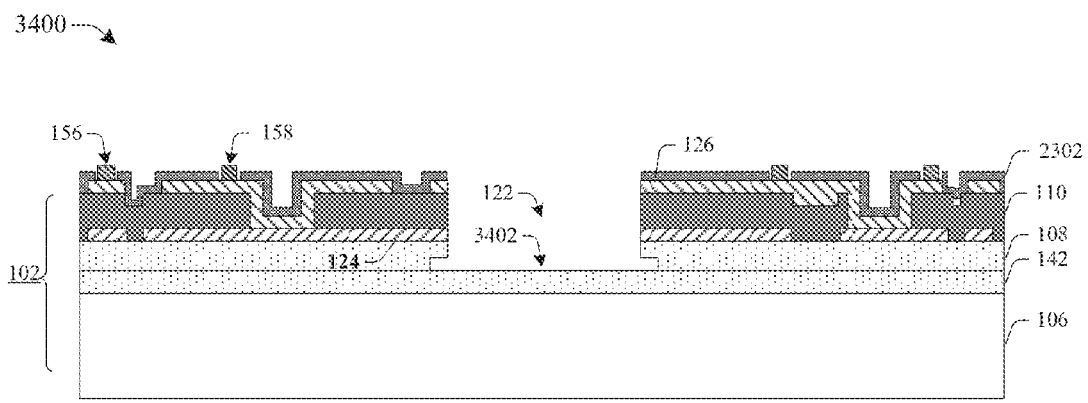
FIGS. 34-38 illustrate a series of cross-sectional views of some embodiments of a MEMS package at various stages of manufacture.

FIG. 34 shows a cross-sectional view 3400 of a MEMS IC 102 after a series of manufacturing steps corresponding to acts 3302-3312 according to some embodiments. FIGS. 20-25 can be referred as example cross-sectional views of the manufacturing steps. As shown in FIG. 34, a first dielectric layer 142 is formed over a MEMS substrate 106. A second dielectric layer 108 is formed over the first dielectric layer 142. A lateral recess 3402 is formed within a lower portion of the second dielectric layer 108 adjacent to the first dielectric layer 142. The lateral recess 3402 can be formed by forming an etch stop layer in position on the first dielectric layer 142 prior to the forming of the second dielectric layer and removing the etch stop layer later. A bottom electrode 124, a piezoelectric layer 110 and a top electrode 126 are subsequently formed in that order over the second dielectric layer 108. In some embodiments, a VHF barrier layer 2302 is formed along profile of the top electrode 126 to protect the work piece from vapor hydrofluoric acid used in a following etch process. The etch is performed to form an opening 122 through the top electrode 126, the piezoelectric layer 110, the bottom electrode 124 and a portion of the second dielectric layer 108 over the etch stop layer. In some embodiments, some bonding pads 156 and additional metal pads 158 can be formed over the top electrode 126. The bonding pads 156 can be a series of separate pads or a continuous rectangular or circular ring comprising metals such as aluminum (Al), germanium (Ge), gold (Au), copper (Cu), Tin (Sn) or alloys, formed at a periphery of the MEMS device. The additional metal pads 158 can be made of the same material in the same process step with the bonding pads 156 and be formed at an inner position relative to the bonding pad 156 to provide electrical connections.

Figure 35:
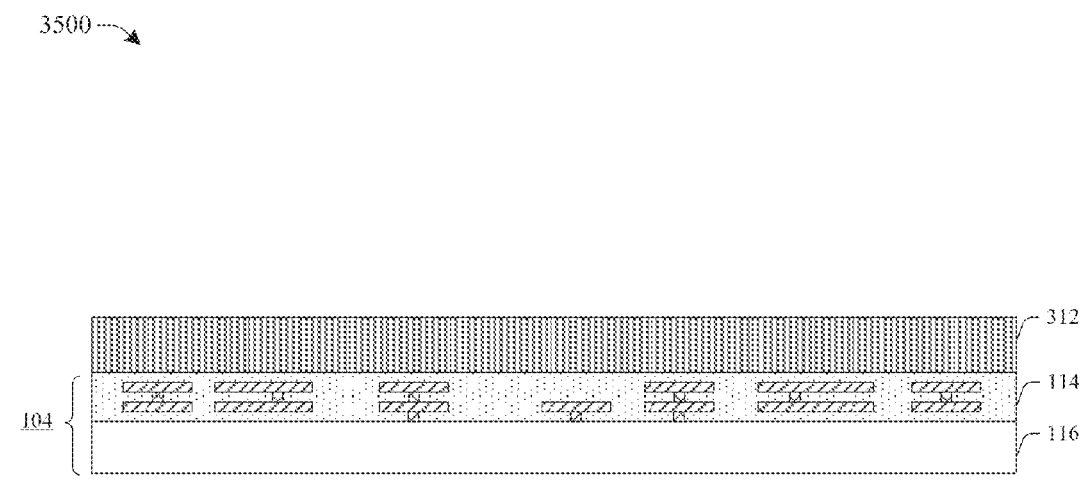

FIG. 35 shows a cross-sectional view 3500 corresponding to act 3314 according to some embodiments. As shown in FIG. 35, a CMOS IC 104 is received and a support layer 312 is formed on the CMOS IC 104. The CMOS IC 104 comprises CMOS devices disposed on a substrate and an electrical interconnect structure 114 disposed thereon. The electrical interconnect structure 114 includes a plurality of metal interconnect layers disposed within an ILD layer. The support layer 312 is disposed over the electrical interconnect structure 114. In some embodiments, the support layer 312 can comprise a photoresist material such as polyimide, SU-8, PMMA, etc. In some embodiments, the support layer 312 can be a photoresist material coated (spun on as a liquid) over the CMOS IC 104 and then baked. The support layer 312 has a height h, which varies depending on the application to provide a sufficient back cavity for the MEMS device. In some embodiments, the height h can be in a range of from about 20 μm to about 250 μm.

Figure 36:
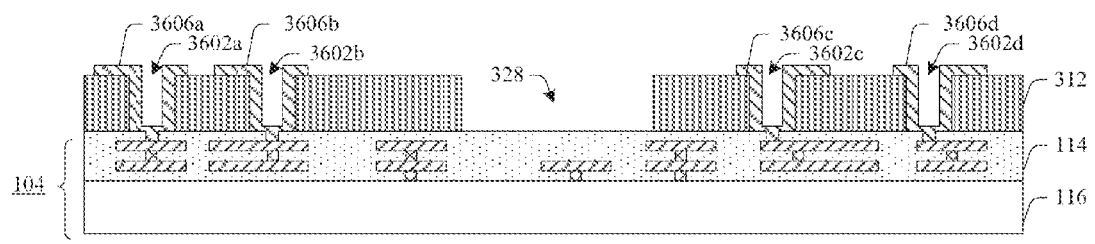

FIG. 36 shows a cross-sectional view 3600 corresponding to act 3316 according to some embodiments. As shown in FIG. 36, an opening 328 is formed at a position vertically aligned with the flexible diaphragm to be formed in the support layer 312. Some vias 3602 (e.g. 3602a, 3602b, 3602c, 3602d, etc.) are formed through the support layer 312. Metal layers 3606 (e.g. 3602a, 3602b, 3602c, 3602d, etc.) are formed through the vias 3602, along sidewalls of the vias 3602 in some embodiments, and extending over the support layer 312. The metal layers 3606 can be made of materials that are the same as or different from materials of metal interconnect layers of the electrical interconnect structure 114, such as aluminum or copper. In some embodiments, the metal layers 3606 are formed respectively connected to the metal interconnect layers of the electrical interconnect structure 114. In some embodiments, the opening 328 and the vias 3602 are formed with substantially vertical sidewalls.

Figure 37:
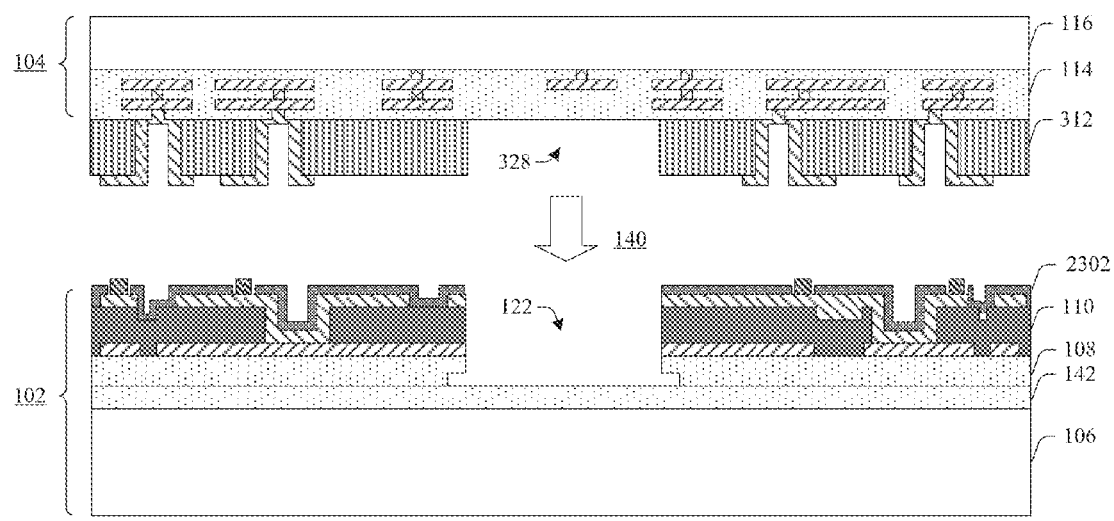

FIG. 37 shows a cross-sectional view 3700 corresponding to act 3318 according to some embodiments. As shown in FIG. 37, the CMOS IC 104 is bonded to the MEMS IC 102. A back cavity 140 is formed by enclosing the opening 328 of the support layer 312 and the opening 122 of the MEMS IC 102 over the flexible diaphragm to be formed.

Figure 38:
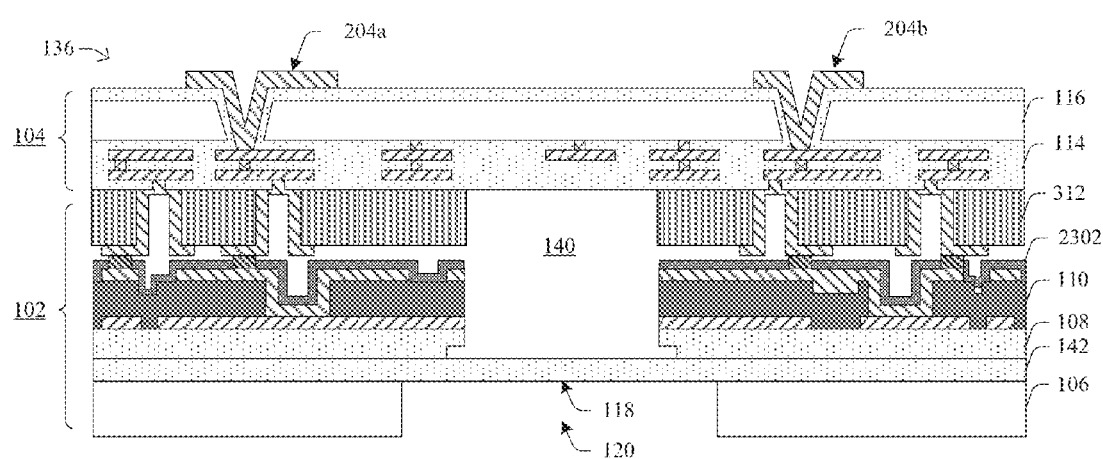

FIG. 38 shows a cross-sectional view 3800 corresponding to act 3320 according to some embodiments. As shown in FIG. 38, conductive layers 204 (e.g. 204a, 204b) are formed at a back side 136 of the CMOS IC 104 through a CMOS substrate 116. In some embodiments, the conductive layers 204 are separately connected to metal layers of the electrical interconnect structure 114. The conductive layers 204 can also be coupled to the CMOS and/or MEMS devices disposed in the CMOS IC 104 and the MEMS IC 102. An etch is performed through the MEMS substrate 106 to form an opening 120 and expose a portion of the dielectric layer 142 to form the flexible diaphragm 118. A photoresist material (not shown) can cover the back side 136 of the CMOS IC 104 prior to the etch and be removed after the etch. The photoresist material is configured to protect the workpiece from applied etching chemicals.

Figure 39:
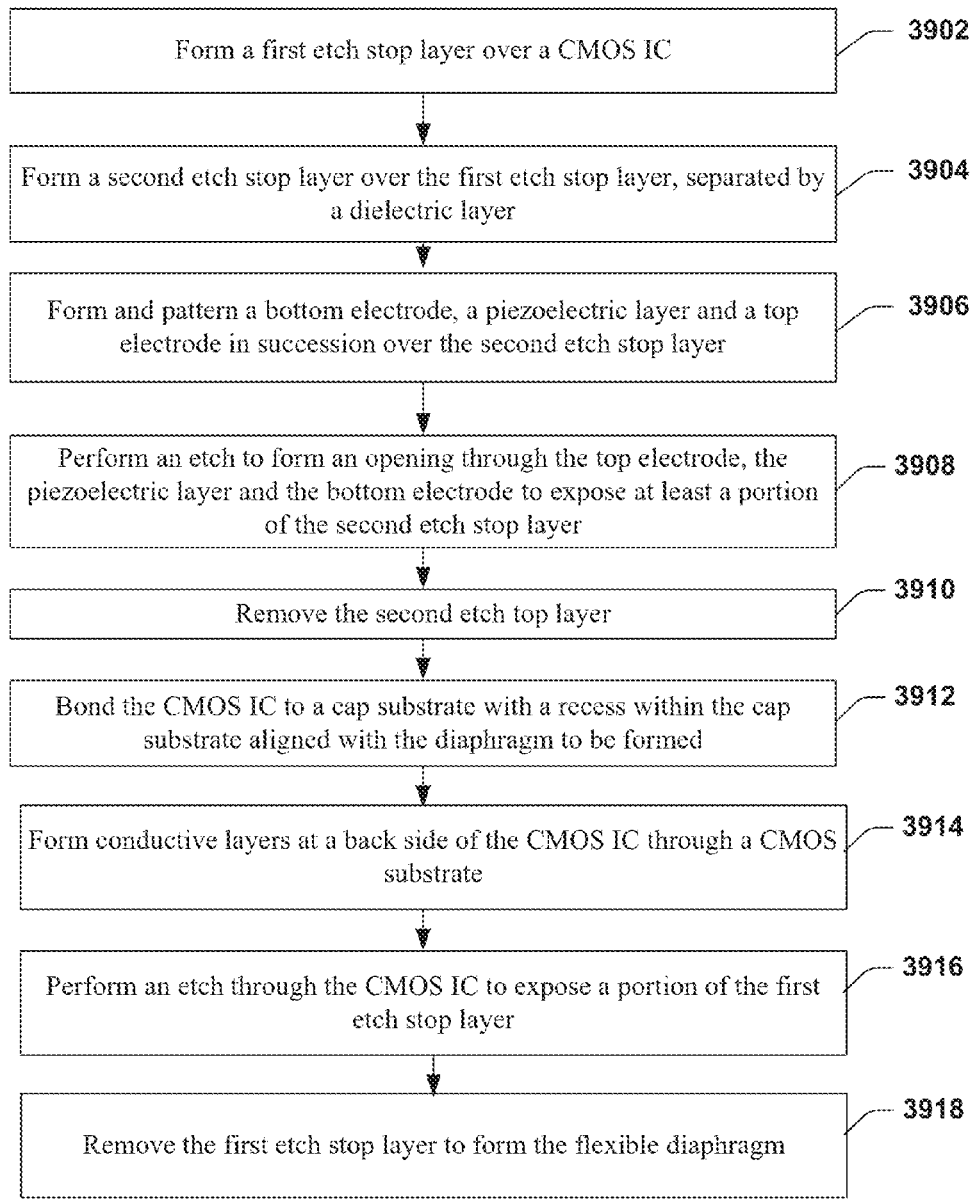
FIG. 39 illustrates a flow chart of some embodiments of a method for manufacturing a MEMS package.

FIG. 39 shows a flow diagram of a method 3900 for manufacturing a MEMS package according to some embodiments. An example of the MEMS package is shown in FIG. 4.

At act 3902, a CMOS IC is received. A first etch stop layer is formed over the CMOS IC.

At act 3904, a dielectric layer is formed over the first etch stop layer. A second etch stop layer is formed and patterned over the dielectric layer.

At act 3906, a bottom electrode, a piezoelectric layer and a top electrode are formed and patterned over the second etch stop layer.

At act 3908, an etch is performed to form an opening through the top electrode, the piezoelectric layer and the bottom electrode to expose at least a portion of the second etch stop layer.

At act 3910, the second etch stop layer is removed.

At act 3912, the CMOS IC is bonded to a cap substrate. A recess is prepared within the cap substrate aligned with the flexible diaphragm to be formed.

At act 3914, conductive layers are formed at a back side of the CMOS IC through a back substrate.

At act 3916, an etch is performed through the CMOS IC to expose a portion of the first etch stop layer.

At act 3918, the first etch stop layer is removed to form the flexible diaphragm.

FIGS. 40-48 show a series of cross-sectional views that collectively depict formation of a MEMS package according to some embodiments. Although FIGS. 40-48 are described in relation to the method 3300, it will be appreciated that the structures disclosed in FIGS. 40-48 are not limited to the method 3300, but instead may stand alone as structures independent of the method 3300. Similarly, although the method 3300 is described in relation to FIGS. 40-48, it will be appreciated that the method 3300 is not limited to the structures disclosed in FIGS. 40-48, but instead may stand alone independent of the structures disclosed in FIGS. 40-48.

Figure 40:
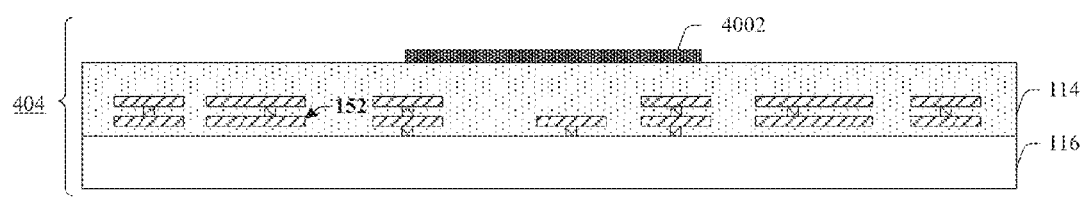
FIGS. 40-48 illustrate a series of cross-sectional views of some embodiments of a MEMS package at various stages of manufacture.

FIG. 40 shows a cross-sectional view 4000 corresponding to act 3902 according to some embodiments. As shown in FIG. 40, a CMOS IC 404 is received. The CMOS IC 404 comprises CMOS devices disposed on a CMOS substrate 116 and an electrical interconnect structure 114 disposed thereon. The electrical interconnect structure 114 includes a plurality of metal interconnect layers 152 disposed within an ILD layer. A first etch stop layer 4002 is formed over the CMOS IC 404.

Figure 41:
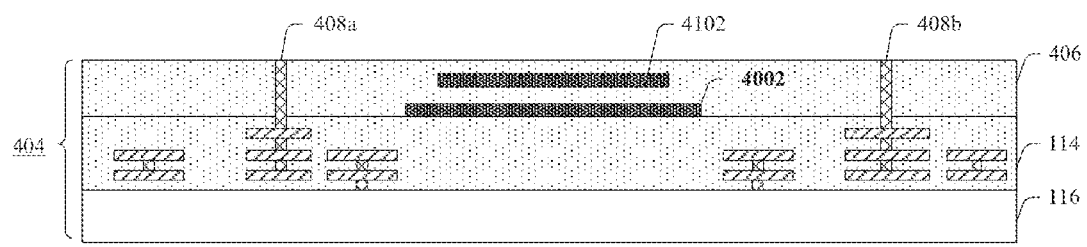

FIG. 41 shows a cross-sectional view 4100 corresponding to act 3904 according to some embodiments. As shown in FIG. 41, a dielectric layer 406 is formed over the first etch stop layer 4002. A second etch stop layer 4102 is formed and patterned over the dielectric layer 406.

In some embodiments, the dielectric layer 406 is thickened after forming the second etch stop layer 4102. Some conductive vias 408 are formed through the dielectric layer 406 and connected to some of the plurality of metal interconnect layers 152 and/or CMOS devices disposed on the CMOS IC 104.

Figure 42:
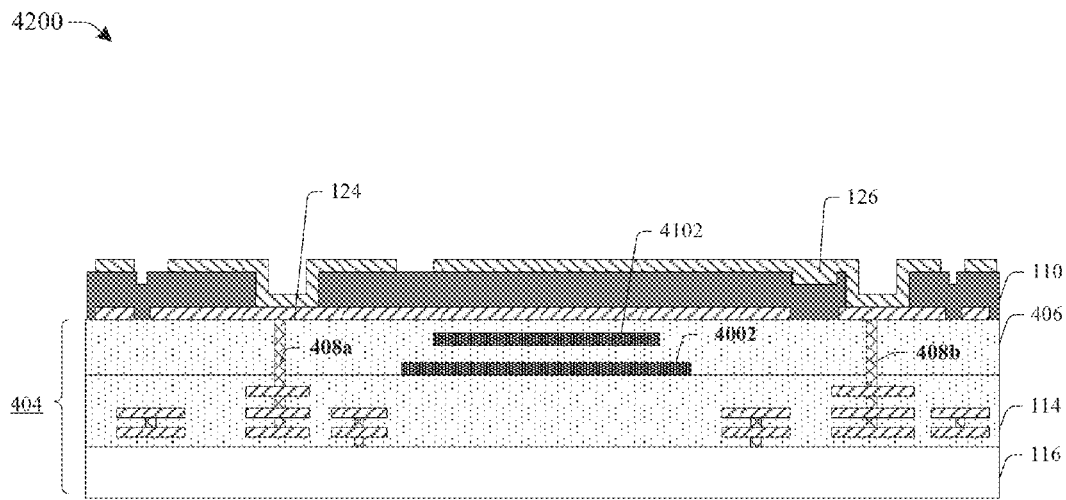

FIG. 42 shows a cross-sectional view 4200 corresponding to act 3906 according to some embodiments. As shown in FIG. 42, a bottom electrode 124, a piezoelectric layer 110 and a top electrode 126 are formed and patterned over the second etch stop layer 4102 and the dielectric layer 406.

Figure 43:
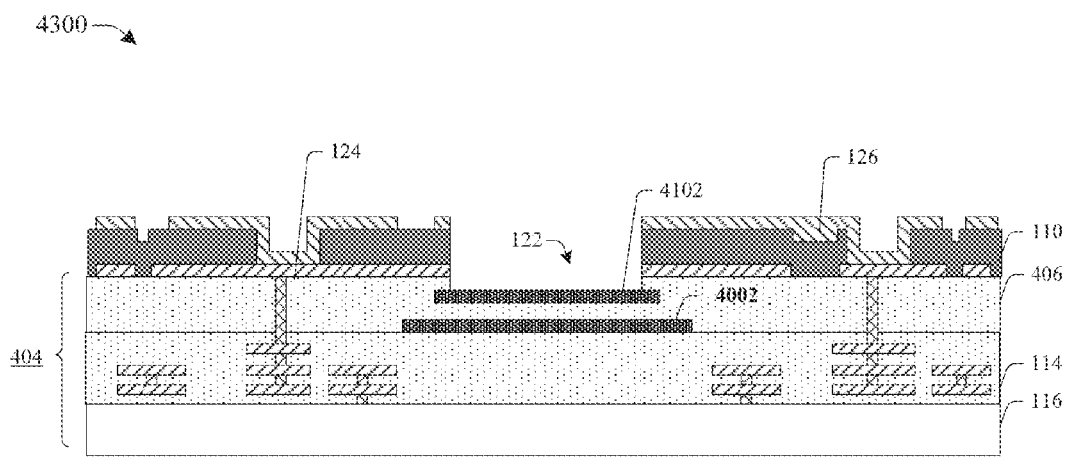

FIG. 43 shows a cross-sectional view 4300 corresponding to act 3908 according to some embodiments. As shown in FIG. 43, an etch is performed to form an opening 122 through the top electrode 126, the piezoelectric layer 110 and the bottom electrode 124 to expose at least a portion of the second etch stop layer 4102.

Figure 44:
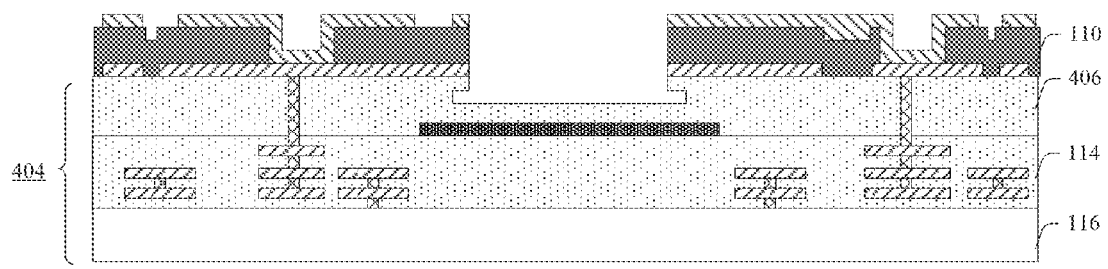

FIG. 44 shows a cross-sectional view 4400 corresponding to act 3910 according to some embodiments. As shown in FIG. 44, the second etch stop layer 4102 is selectively removed.

Figure 45:
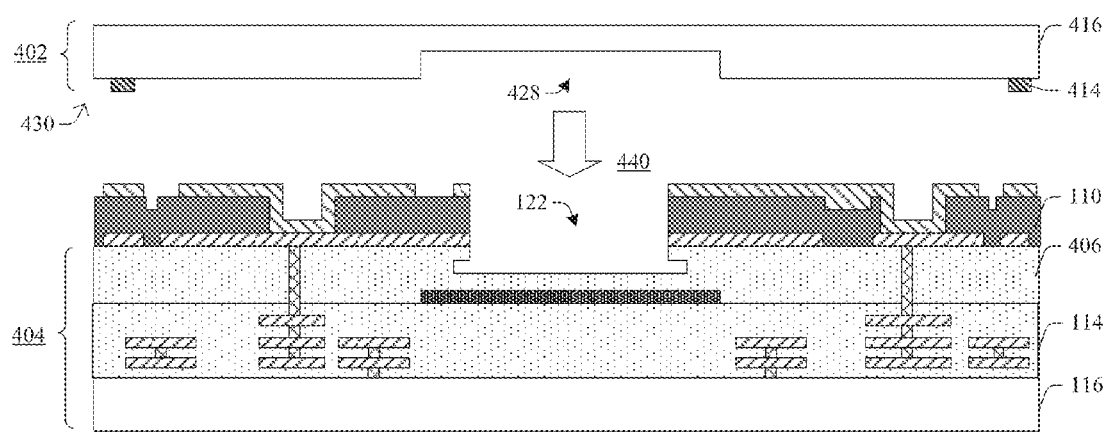

FIG. 45 shows a cross-sectional view 4500 corresponding to act 3912 according to some embodiments. As shown in FIG. 45, the CMOS IC 404 is bonded to a cap substrate 402. An opening 428 is prepared within the cap substrate 402 at a front side 430 aligned with the flexible diaphragm to be formed. A bonding pad 414 is formed at the front side 430 of the cap substrate 402. The bonding process encloses a back cavity 440 from the openings 428, 122.

Figure 46:
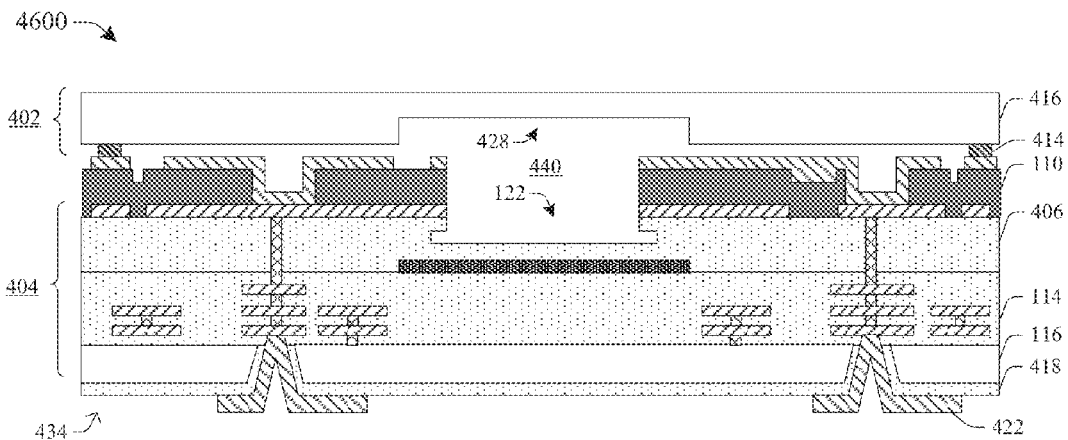

FIG. 46 shows a cross-sectional view 4600 corresponding to act 3914 according to some embodiments. As shown in FIG. 46, conductive layers 422 are formed at a back side 434 of the CMOS IC 404 through a CMOS substrate 116. A dielectric layer 418 can be formed to separate the conductive layers 422 from the CMOS substrate 116.

Figure 47:
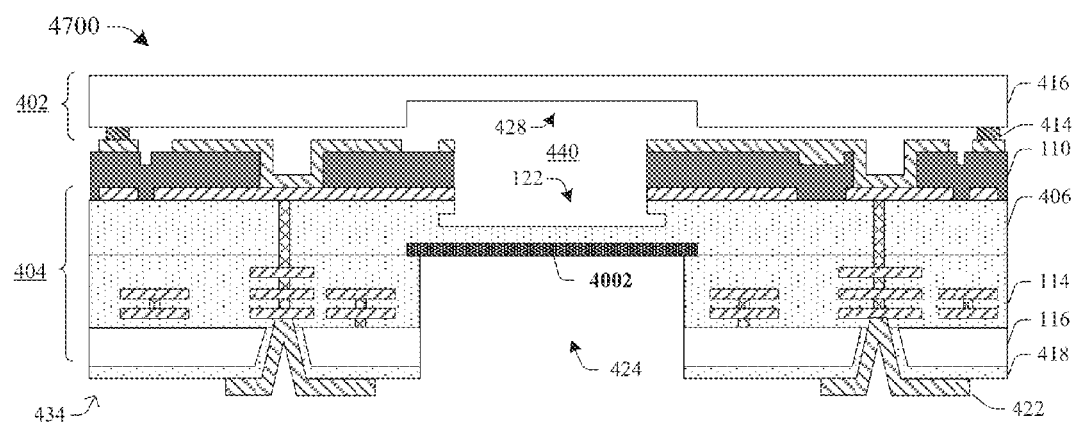

FIG. 47 shows a cross-sectional view 4700 corresponding to act 3916 according to some embodiments. As shown in FIG. 47, an etch is performed through the CMOS substrate 116 and electrical interconnect structure 114 of the CMOS IC 404 to form an opening 420 and to expose a portion of the first etch stop layer 4002.

Figure 48:
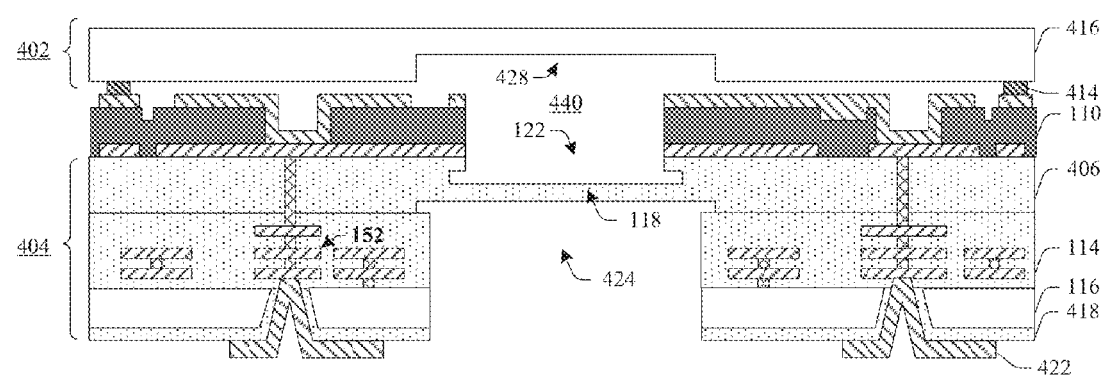

FIG. 48 shows a cross-sectional view 4800 corresponding to act 3918 according to some embodiments. As shown in FIG. 48, the first etch stop layer 4002 is selectively removed to form the flexible diaphragm 118.

Thus, as can be appreciated from above, the present disclosure relates to a MEMS package and associated methods. The MEMS package comprises a MEMS substrate bonded to another substrate to form a back cavity over a flexible diaphragm. In some embodiments, a COMS substrate can be bonded to the MEMS substrate by eutectic bonding or direct bonding. In some other embodiments, a MEMS device can be disposed over the CMOS substrate and be bonded to a cap substrate to form the back cavity. A wafer level process is used to form the MEMS package. For example, the wafer level process uses stack bonding of a CMOS wafer to a MEMS wafer to connect CMOS devices and MEMS devices. Then the bonded wafer is diced into separate chips. Further, in some embodiments, the wafer level process attaches a support layer with an opening in position to the CMOS wafer to form the back cavity and, in some additional embodiments, includes a VHF protective layer to prevent damage from vapor hydrofluoric acid employed during the process.

In some embodiments, the present disclosure provides a MEMS package. The MEMS package includes a MEMS IC comprising a MEMS substrate, a dielectric layer disposed over the MEMS substrate, and a piezoelectric layer disposed over the dielectric layer. The dielectric layer includes a flexible diaphragm made of dielectric material and the piezoelectric layer includes a piezoelectric layer opening over the flexible diaphragm. A CMOS IC includes a CMOS substrate and an electrical interconnect structure. The CMOS IC is bonded to the MEMS IC so the electrical interconnect structure is proximate to the piezoelectric layer and so the CMOS IC encloses a back cavity over the flexible diaphragm. A support layer is disposed between the electrical interconnect structure and the piezoelectric layer. The support layer has a support layer opening which is disposed at a position vertically aligned with the flexible diaphragm and which is a part of the back cavity.

In other embodiments, the present disclosure provides a MEMS package. The MEMS package includes a CMOS IC including a CMOS substrate and an electrical interconnect structure over the CMOS substrate. A dielectric layer is disposed over the electrical interconnect structure and includes a flexible diaphragm made of dielectric material. A piezoelectric layer is disposed over the dielectric layer and has a piezoelectric layer opening over the flexible diaphragm. A cap substrate is disposed over the piezoelectric layer and has a cap substrate opening disposed at a position vertically aligned with the flexible diaphragm and enclosing a back cavity over the flexible diaphragm.

In yet other embodiments, the present disclosure provides a method for manufacturing a MEMS package. The method comprises forming a flexible diaphragm made of dielectric material, where the dielectric material corresponds to a dielectric layer and is arranged over a MEMs substrate. The method further comprises forming a piezoelectric layer over the flexible diaphragm and the dielectric layer, the piezoelectric layer having an opening vertically aligned with the flexible diaphragm. The method further comprises forming a support layer over a CMOS IC, the support layer having an opening vertically aligned with the flexible diaphragm. The method further comprises bonding the semiconductor substrate and the CMOS IC through the piezoelectric layer and the support layer, thereby enclosing a back cavity over the diaphragm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A microelectromechanical systems (MEMS) package comprising:
   a MEMS IC comprising a MEMS substrate, a dielectric layer disposed over the MEMS substrate, and a piezoelectric layer disposed over the dielectric layer, wherein the dielectric layer includes a flexible diaphragm made of dielectric material and wherein the piezoelectric layer includes a piezoelectric layer opening over the flexible diaphragm;
   a CMOS IC comprising a CMOS substrate and an electrical interconnect structure, wherein the CMOS IC is bonded to the MEMS IC so the electrical interconnect structure is proximate to the piezoelectric layer and so the CMOS IC encloses a back cavity over the flexible diaphragm; and
   a support layer disposed between the electrical interconnect structure and the piezoelectric layer, the support layer having a support layer opening which is disposed at a position vertically aligned with the flexible diaphragm and which is a part of the back cavity.

2. The MEMS package of claim 1, wherein a height of the support layer opening is in a range of from about 20 μm to about 250 μm.

3. The MEMS package of claim 1, wherein the support layer is a silicon substrate fusion bonded to the CMOS IC.

4. The MEMS package of claim 1, wherein the support layer is made of photoresist.

5. The MEMS package of claim 1, further comprising a bottom electrode disposed between the dielectric layer and the piezoelectric layer and a top electrode disposed on the piezoelectric layer.

6. The MEMS package of claim 5, further comprising a VHF protective layer covering the top electrode and the piezoelectric layer.

7. The MEMS package of claim 5, further comprising first and second highly-doped semiconductor pillars within the MEMS substrate of the MEMS IC, the first and second highly-doped semiconductor pillars surrounded by first and second rings of dielectric material, respectively, and electrically connected to the bottom and top electrodes, respectively.

8. The MEMS package of claim 7, wherein the first and second highly doped semiconductor pillars are respectively connected to the bottom and top electrodes by respective conductive vias disposed through the dielectric layer between the MEMS substrate and the bottom and top electrodes.

9. The MEMS package of claim 7, further comprising first and second trenches or rings of conductive material disposed within the first and second rings of dielectric material, respectively.

10. The MEMS package of claim 5, wherein the CMOS IC comprises first and second metal layers disposed through a CMOS substrate to extend over a back side of the CMOS IC, wherein the first metal layer is electrically connected to the bottom electrode and the second metal layer is electrically connected to the top electrode.

11. The MEMS package of claim 5, wherein the CMOS IC comprises an inner metal layer disposed through the support layer to connect the bottom electrode or the top electrode to the interconnect structure, and an outer metal layer disposed through the support layer and extending over a surface facing the MEMS IC, bonding to a bonding pad disposed over the MEMS IC.

12. The MEMS package of claim 5, wherein a sidewall of the piezoelectric layer disposed within the back cavity is tapered and adjacent to sidewalls of the bottom electrode, or wherein the top electrode has a central portion recessed back relative to the sidewall of the piezoelectric layer.

13. The MEMS package of claim 1, wherein the MEMS substrate of the MEMS IC comprises a through opening vertically aligned with the flexible diaphragm and has a greater lateral dimension than that of the flexible diaphragm.

14. The MEMS package of claim 1, wherein the piezoelectric layer comprises a through opening vertically aligned with the flexible diaphragm and has a smaller lateral dimension than that of the flexible diaphragm.

15. A microelectromechanical systems (MEMS) package comprising:
a CMOS IC comprising: a CMOS substrate, and an electrical interconnect structure disposed over the CMOS substrate, wherein the electrical interconnect structure is configured to electrically couple devices of the CMOS substrate to one another;
a dielectric layer disposed over the electrical interconnect structure and including a flexible diaphragm made of dielectric material;
a piezoelectric layer disposed over the dielectric layer and having a piezoelectric layer opening over the flexible diaphragm; and
a cap substrate disposed over the piezoelectric layer, the cap substrate having a cap substrate opening disposed at a position vertically aligned with the flexible diaphragm and enclosing a back cavity over the flexible diaphragm.

16. The MEMS package of claim 15, wherein a height of the cap substrate opening is in a range of from about 20 μm to about 250 μm.

17. The MEMS package of claim 15, wherein the piezoelectric layer opening has a smaller lateral dimension than that of the flexible diaphragm.

18. The MEMS package of claim 15, wherein the CMOS IC comprises a through opening vertically aligned with the flexible diaphragm to expose the flexible diaphragm.

19. A method of manufacturing a microelectromechanical systems (MEMS) package, comprising:
forming a flexible diaphragm made of a dielectric material, the dielectric material corresponding to a dielectric layer and arranged over a MEMS substrate;
forming a piezoelectric layer over the flexible diaphragm and the dielectric layer, the piezoelectric layer having an opening vertically aligned with the flexible diaphragm;
forming a support layer over a CMOS IC, the support layer having an opening vertically aligned with the flexible diaphragm; and
bonding the MEMS substrate and the CMOS IC through the piezoelectric layer and the support layer, thereby enclosing a back cavity over the diaphragm.

20. The method of claim 19, wherein the support layer is formed over the CMOS IC by fusion bonding a semiconductor substrate to the CMOS IC.

* * * * *